US009583463B2

(12) United States Patent
Kim et al.

(10) Patent No.: US 9,583,463 B2
(45) Date of Patent: Feb. 28, 2017

(54) ARRAY RESISTOR AND SEMICONDUCTOR MODULE

(71) Applicant: Samsung Electronics Co., Ltd., Suwon-si (KR)

(72) Inventors: Seon-Sik Kim, Suwon-si (KR); Changwoo Koo, Seoul (KR); Wooseop Kim, Seoul (KR); Jungjoon Lee, Seoul (KR); Dongmin Jang, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 72 days.

(21) Appl. No.: 14/727,885

(22) Filed: Jun. 2, 2015

(65) Prior Publication Data
US 2016/0037643 A1 Feb. 4, 2016

(51) Int. Cl.
*H05K 7/10* (2006.01)
*H05K 7/12* (2006.01)
(Continued)

(52) U.S. Cl.
CPC .......... *H01L 25/0655* (2013.01); *H05K 1/111* (2013.01); *H05K 3/3442* (2013.01);
(Continued)

(58) Field of Classification Search
USPC .......................... 361/767, 752, 808; 174/557
See application file for complete search history.

(56) References Cited

U.S. PATENT DOCUMENTS 6,704,209 B2    3/2004  Yamauchi et al.
6,731,013 B2 *  5/2004  Juso ..................... H01L 23/3128
                                                          174/534
(Continued)

FOREIGN PATENT DOCUMENTS

JP      H08-213219 A    8/1996
JP      H11-111512 A    4/1999
(Continued)

*Primary Examiner* — Andargie M Aychillhum
(74) *Attorney, Agent, or Firm* — Muir Patent Law, PLLC

(57) ABSTRACT

A semiconductor module includes: a module board, a plurality of chips mounted on the module board, and a plurality of array resistors mounted on the module board, the plurality of array resistors including at least a first array resistor. The first array resistor may include a substrate comprising a top surface, a bottom surface opposite the top surface, and first to fourth side surfaces connecting the top surface to the bottom surface, the first and third side surfaces being opposite each other, and the second and fourth side surfaces being opposite each other; a plurality of first electrodes disposed on the first side surface of the substrate, each first electrode including at least a first portion on the first side surface of the substrate and a second portion on the bottom surface of the substrate; a plurality of second electrodes disposed on the third side surface of the substrate, each second electrode opposite a respective first electrode and including at least a first portion on the third side surface of the substrate and a second portion on the bottom surface of the substrate; for each pair of respective first and second electrodes opposite each other, a resistor disposed on the substrate between the respective first and second electrodes; and at least one third electrode disposed on the second side surface of the substrate, the third electrode including at least a first portion on the second side surface of the substrate and a second portion on the bottom surface of the substrate. Each of the first
(Continued)

electrodes, the second electrodes, and the third electrode may be bonded to the module board.

20 Claims, 19 Drawing Sheets

(51) Int. Cl.
    *H01L 25/065*     (2006.01)
    *H05K 1/11*     (2006.01)
    *H05K 3/34*     (2006.01)

(52) U.S. Cl.
    CPC ............... *H01L 2924/0002* (2013.01); *H05K 2201/09381* (2013.01); *H05K 2201/10022* (2013.01); *H05K 2201/10159* (2013.01)

(56) References Cited

U.S. PATENT DOCUMENTS

| | | | |
|---|---|---|---|
| 7,227,443 | B2 | 6/2007 | Kuriyama |
| 8,179,226 | B2 | 5/2012 | Ryu et al. |
| 2007/0075826 | A1 | 4/2007 | Liu et al. |
| 2010/0225439 | A1 | 9/2010 | Han et al. |
| 2014/0146507 | A1* | 5/2014 | Lee .................. H01L 23/49822 361/783 |

FOREIGN PATENT DOCUMENTS

| | | |
|---|---|---|
| JP | H11-204316 A | 7/1999 |
| JP | 3623477 B2 | 2/2005 |
| KR | 10-2010-0095269 A | 8/2010 |

\* cited by examiner

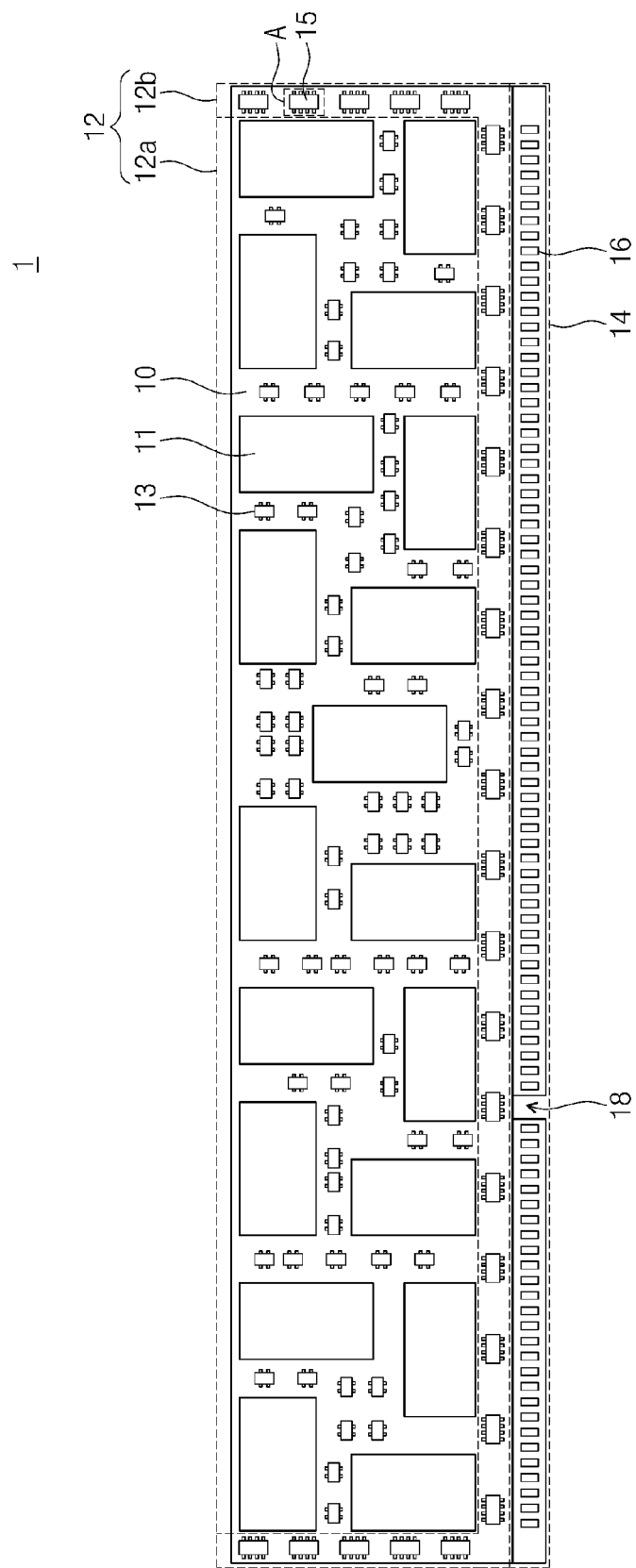

ARRAY RESISTOR AND SEMICONDUCTOR MODULE

CROSS-REFERENCE TO RELATED APPLICATIONS

This U.S. non-provisional patent application claims priority under 35 U.S.C. §119 of Korean Patent Application No. 10-2014-0096669, filed on Jul. 29, 2014, the entire contents of which are hereby incorporated by reference.

BACKGROUND

The present disclosure herein relates to an array resistor and a semiconductor module such as a memory module.

In general, surface mount type (SMT) devices having various shapes are provided in an electric apparatus. For example, one type of SMT device includes a varistor device and a chip network resistor. The varistor device includes a resistor-varistor multi chip and an inductor-varistor multi chip. Each of the resistor-varistor multi chip and the inductor-varistor multi chip has a structure in which a resistor, an inductor, and a varistor are selectively coupled on a body thereof. In certain situations, the body used in the varistor device has a structure in which a plurality of insulating substrates are stacked. A metal wire and a resistor line are disposed on each of the insulating substrates, and then the insulating substrates are coupled to each other to form the varistor device. On the other hand, the chip network resistor that is called an array resistor has a structure in which a plurality of resistors are disposed on a body thereof so as to increase a degree of integration of an electric apparatus. For example, the body of the array resistor may be provided with one insulating substrate, and the plurality of resistors are disposed on a surface of the one insulating substrate.

SUMMARY

The present disclosure provides an array resistor having more improved bonding force.

The present disclosure also provides a semiconductor module such as a memory module including an array resistor having more improved bonding force.

The object of the inventive concept is not limited to the aforesaid, but other objects not described herein will be clearly understood by those skilled in the art from descriptions below.

Embodiments of the inventive concept provide a semiconductor module, including a module board, a plurality of chips mounted on the module board, and a plurality of array resistors mounted on the module board. The plurality of array resistors may include at least a first array resistor including: a substrate comprising a top surface, a bottom surface opposite the top surface, and first to fourth side surfaces connecting the top surface to the bottom surface, the first and third side surfaces being opposite each other, and the second and fourth side surfaces being opposite each other; a plurality of first electrodes disposed on the first side surface of the substrate, each first electrode including at least a first portion on the first side surface of the substrate and a second portion on the bottom surface of the substrate; a plurality of second electrodes disposed on the third side surface of the substrate, each second electrode opposite a respective first electrode and including at least a first portion on the third side surface of the substrate and a second portion on the bottom surface of the substrate; for each pair of respective first and second electrodes opposite each other, a resistor disposed on the substrate between the respective first and second electrodes; and at least one third electrode disposed on the second side surface of the substrate, the third electrode including at least a first portion on the second side surface of the substrate and a second portion on the bottom surface of the substrate. The semiconductor module may further include a plurality of module pads on a surface of the module board; a first solder contacting a first module pad of the plurality of module pads and one of the first electrodes; a second solder contacting a second module pad of the plurality of module pads and one of the second electrodes; and a third solder contacting a module pad of the plurality of module pads and the third electrode.

In other embodiments of the inventive concept, a semiconductor module includes: a module board, a plurality of chips mounted on the module board, and a plurality of array resistors mounted on the module board, the plurality of array resistors including at least a first array resistor. The first array resistor may include a substrate comprising a top surface, a bottom surface opposite the top surface, and first to fourth side surfaces connecting the top surface to the bottom surface, the first and third side surfaces being opposite each other, and the second and fourth side surfaces being opposite each other; a plurality of first electrodes disposed on the first side surface of the substrate, each first electrode including at least a first portion on the first side surface of the substrate and a second portion on the bottom surface of the substrate; a plurality of second electrodes disposed on the third side surface of the substrate, each second electrode opposite a respective first electrode and including at least a first portion on the third side surface of the substrate and a second portion on the bottom surface of the substrate; for each pair of respective first and second electrodes opposite each other, a resistor disposed on the substrate between the respective first and second electrodes; and at least one third electrode disposed on the second side surface of the substrate, the third electrode including at least a first portion on the second side surface of the substrate and a second portion on the bottom surface of the substrate. Each of the first electrodes, the second electrodes, and the third electrode may be bonded to the module board.

In other embodiments, a semiconductor memory module includes a printed circuit board (PCB) including a chip area having a first part and a second part surrounding three side surfaces of the first part and a connector area disposed at one side of the chip area; and an array resistor disposed on the second part of the chip area to contact a plurality of module pads disposed on a top surface of the PCB. The array resistor includes: a substrate including a top surface, a bottom surface opposite the top surface, and first to fourth side surfaces connecting the top surface to the bottom surface, wherein the first and third side surfaces are opposite each other and the second and fourth side surfaces are opposite each other; a plurality of first central electrodes and a plurality of second central electrodes, each first and second electrode respectively disposed on the second and fourth side surfaces opposite each other on the substrate; a resistor disposed between each pair of respective first and second central electrodes opposite each other on the substrate; and an end electrode disposed on at least one of the first and third side surfaces of the substrate. The end electrode and a first of the central electrodes are bonded to a same first module pad of the plurality of module pads.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 1 is a plan view of a semiconductor memory module according to an embodiment of the inventive concept;

FIGS. 2A to 5A are enlarged perspective views of an array resistor that corresponds to a portion A of FIG. 1 according to Embodiments 1 to 4 of the inventive concept;

FIGS. 2B to 5B are cross-sectional views of the array resistor, taken along line I-I' of FIGS. 2A to 5A according to Embodiments 1 to 4 of the inventive concept;

FIGS. 2C to 5C are cross-sectional views of the array resistor, taken along line II-II' of FIGS. 2A to 5A according to Embodiments 1 to 4 of the inventive concept;

FIGS. 2D to 5D are cross-sectional views of the array resistor, taken along line II-II' of FIGS. 2A to 5A according to Embodiments 1 to 4 of the inventive concept;

FIGS. 2E to 5E are cross-sectional views of the array resistor, taken along line III-III' of FIGS. 2A to 5A according to Embodiments 1 to 4 of the inventive concept;

FIGS. 2F to 5F are plan views of pads disposed on a substrate and bonded to the array resistor according to Embodiments 1 to 4 of the inventive concept;

DETAILED DESCRIPTION

Figure 2A:
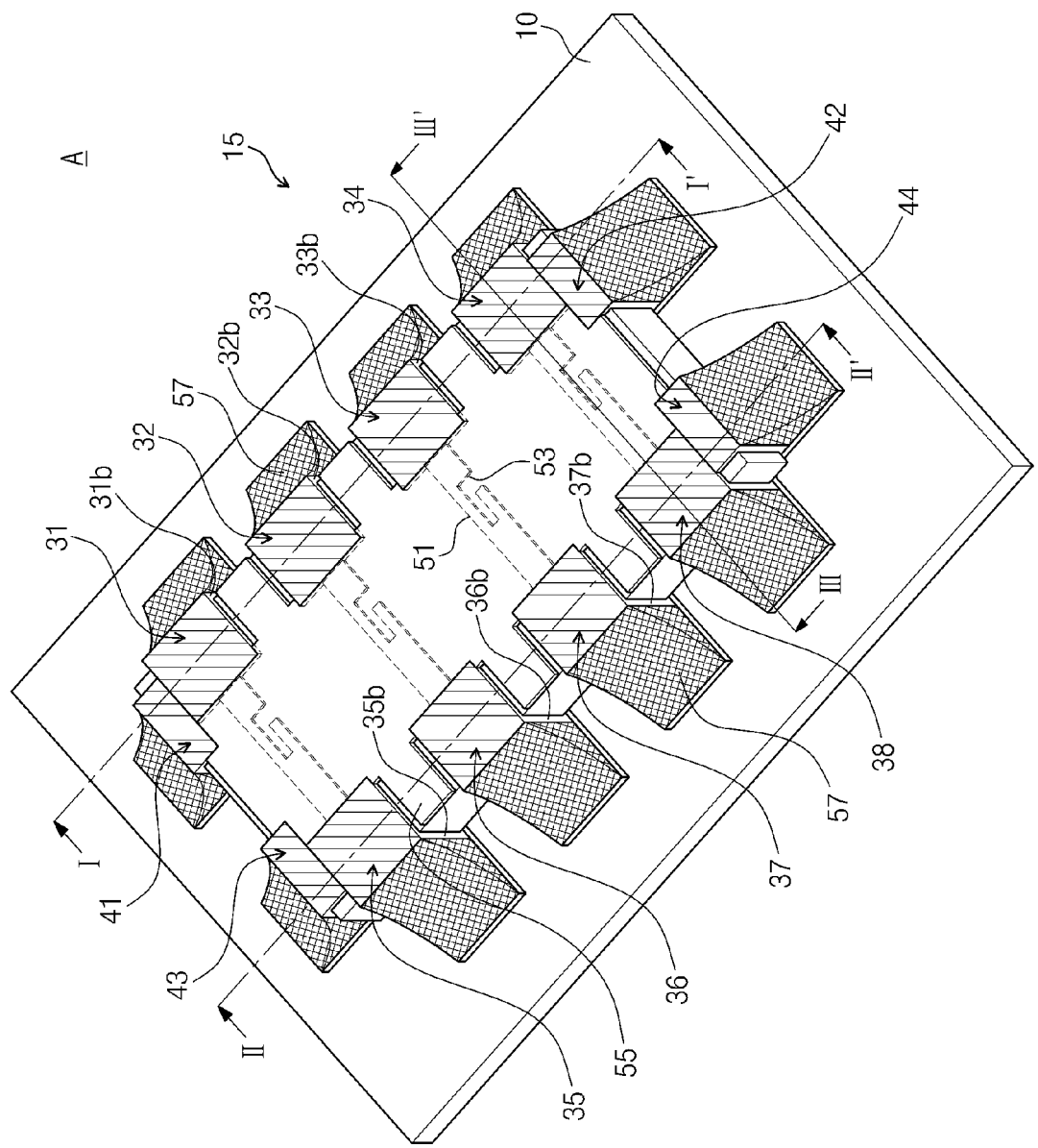
Figure 2B:
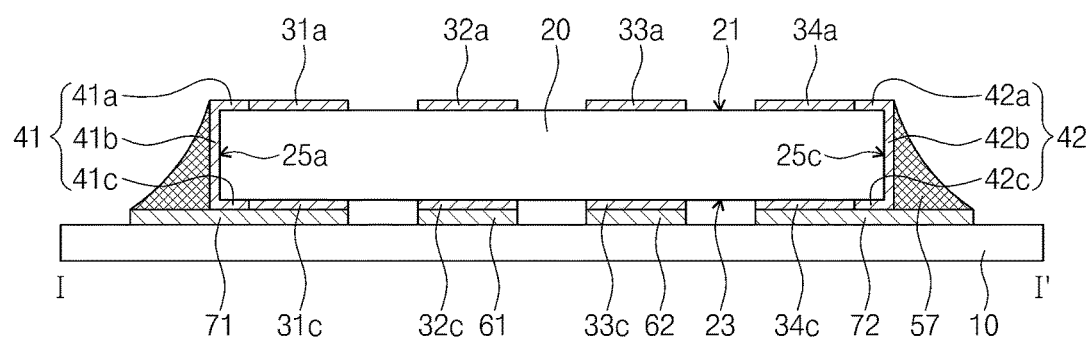
Figure 2C:
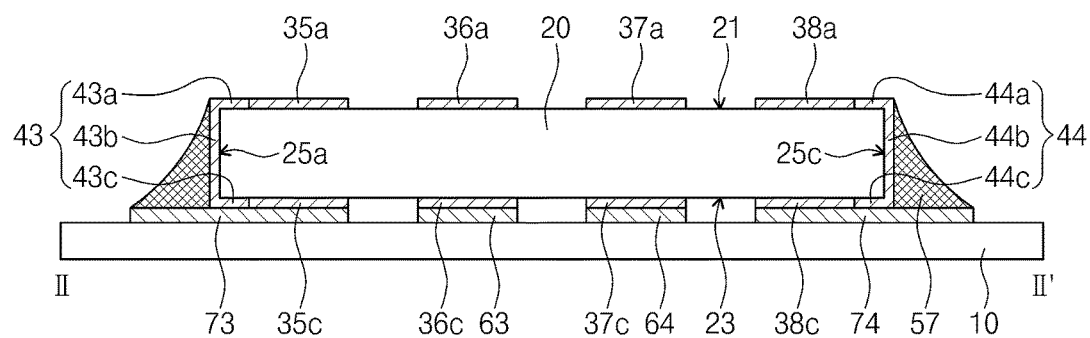

Advantages and features of the inventive concept, and implementation methods thereof will be clarified through following embodiments described with reference to the accompanying drawings. The inventive concept may, however, be embodied in different forms and should not be construed as limited to the embodiments set forth herein. Further, the inventive concept is only defined by scopes of claims. In the drawings, the dimensions of layers and regions are exaggerated for clarity of illustration.

In the following description, the technical terms are used only to explain a specific exemplary embodiment while not limiting the inventive concept. The terms of a singular form may include plural forms unless referred to the contrary. The meaning of "includes," "including," "comprises," and/or "comprising" specifies a component, a process, an operation and/or an element but does not exclude other components, processes, operations, and/or elements. Additionally, the examples in the detailed description will be described with sectional views as ideal exemplary views of the disclosed embodiments. In the figures, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, an etched region illustrated or described as a rectangle will, typically, have rounded or curved features. Thus, the regions illustrated in the figures are schematic in nature and their shapes are not intended to limit the scope of the inventive concept.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another, for example as a naming convention. For example, a first chip could be termed a second chip, and, similarly, a second chip could be termed a first chip without departing from the teachings of the disclosure. Further a device described as a "first" device in the specification may be referred to as a "second" device in one or more claims, based on the context of those claims. Similarly, a device not described in the specification with the name "first" or "second" may be described in a claim using such a term, again, in certain contexts as a naming convention to distinguish certain claimed elements from other claimed elements.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" another elements, there are no intervening elements present. Other words used to describe the relationship between elements should be interpreted in a like fashion (e.g., "between" versus "directly between," "adjacent" versus "directly adjacent," etc.). However, as mentioned above, the term "contact," as used herein refers to direct contact (i.e., touching) unless the context indicates otherwise.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning FIG. 1 is a plan view of a semiconductor memory module according to an embodiment of the inventive concept.

Referring to FIG. 1, a substrate 10 includes a chip area 12 and a connector area 14, also referred to as a chip region 12 and a connector region 14. The connector area 14 may be disposed adjacent to one side of the chip area 12, for example one of the longer sides for a rectangular-shaped substrate 10. The chip area 12 may include a first part 12a and a second part 12b. The first part 12a of the chip area 12 may be disposed on a central portion, or central region, of the chip area 12, and the second part 12b of the chip area 12 may be disposed on an outside of the first part 12a, or an outer region. For example, in one embodiment, the second part 12b of the chip area 12 may be adjacent to, and may surround three sides of the first part 12a of the chip area 12. The first part may be referred to as a chip portion, as it includes a region where chips are mounted, while the second part may be referred to as a portion external to the chip portion (e.g., where no chips are mounted). The substrate 10 may be, for example, a printed circuit board (PCB). Metal wires (not shown) that are variously designed are disposed in the substrate 10 to electrically connect chips mounted on the substrate to each other. Thus, the substrate 10 having chips mounted thereon, particularly memory chips, may function as one semiconductor memory module 1.

The substrate 10 may be configured to have chips mounted thereon. For example, in one embodiment, memory chips 11 may be mounted on the first part 12a of the chip area 12. Each semiconductor device labeled 11 in FIG. 1 may be a memory chip (e.g., a single memory chip formed from a piece of a wafer), or alternatively may be a stack of semiconductor chips, or a semiconductor package including a package substrate and one or more chips stacked thereon. In addition, first array resistors 13 may be mounted on the first part 12a of the chip area 12. As an example, the memory chips 11 may be volatile memory chips, but they are not limited thereto. The memory chips 11 may be attached and electrically connected to substrate pads (not shown) of the substrate 10 by terminals (such as bumps, solder balls, etc., not shown) disposed on surfaces of the memory chips 11. The memory chips 11 may be disposed on the substrate 10 and then may be connected to connection pads 16 disposed on the connector area 14 through the metal wires in the substrate 10. The number of the memory chips 11 may be adjusted according to capacity of a memory to be used in a system that uses the semiconductor memory module 1. In one embodiment, each of the first array resistors 13 may be disposed on an area between the memory chips 11 disposed on the first part 12a of the chip area 12. The first array resistor 13 will be explained together with a second array resistor 15 that will be described later.

In one embodiment, the connector area 14 may be positioned on one surface of the substrate 10 in a band shape (e.g., a linear shape) along a length direction of the substrate 10. The connector area 14 may be correspondingly coupled to a connector of an external device to transmit or receive data while exchanging signals with the memory chips 11 and may support the connector of the external device to realize firm mechanical coupling with the external device. The connection pads 16 are spaced a predetermined distance apart from each other and arranged on the connector area 14 in the length direction of the substrate 10. Each of the connection pads 16 may be formed of a metal material having high conductivity to smoothly transmit the electrical signal between the external device (not shown) and the memory chip 11. The connector area 14 may include a deformation prevention groove 18. The deformation prevention groove 18 functions to prevent the substrate 10 from being deformed.

The second array resistor 15 may be mounted on the second part 12b of the chip area 12. The second array resistor 15 may be provided in plurality, and the plurality of second array resistors 15 may be spaced a predetermined distance apart from each other and arranged on the chip area 12 of the substrate 10 in a line. For example, in one embodiment, the plurality of second array resistors 15 are arranged along three edges of the chip area 12 of the substrate 10 in a line along each edge. In one embodiment, the first and second array resistors 13 and 15 are provided to remove noise generated while electrical signals are exchanged between a memory chip 11 and the external device, and to improve resolution of the signal. For example, each of the first and second array resistors 13 and 15 may be a 4-array resistor chip and include a plurality of resistor elements therein. Thus, the first and second array resistors 13 and 15 transmit a signal transmitted from the outside into the memory chips 11 without overshooting. In certain embodiments, the second array resistors 15 include the features described in the various embodiments below, and the first array resistors 13 may be prior art array resistors.

Each of the first and second array resistors 13 and 15 is not limited to a particular position on the substrate. For example, a first array resistor 13 may be disposed on the second part 12b of the chip area 12, and a second array resistor 15 may be disposed on the first part 12a of the chip area 12.

Figure 2D:
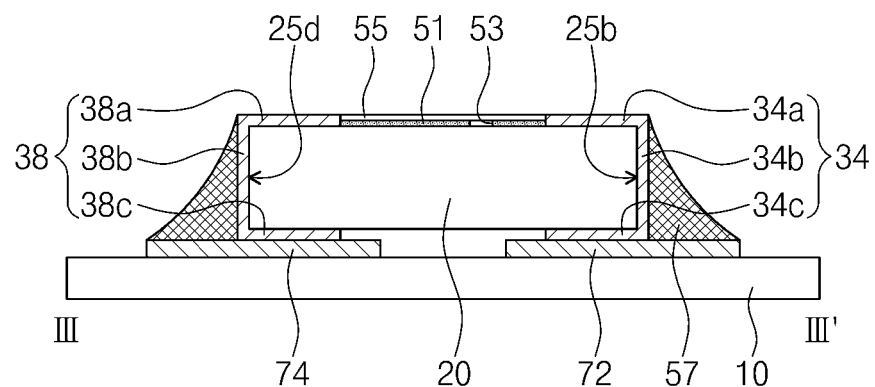
Figure 2E:
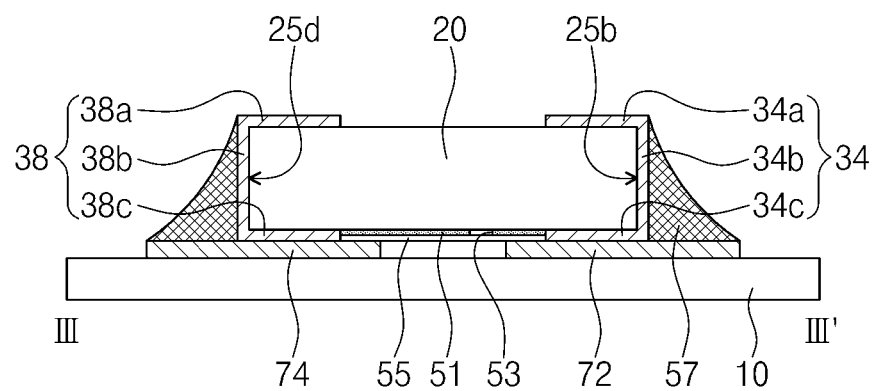
Figure 2F:
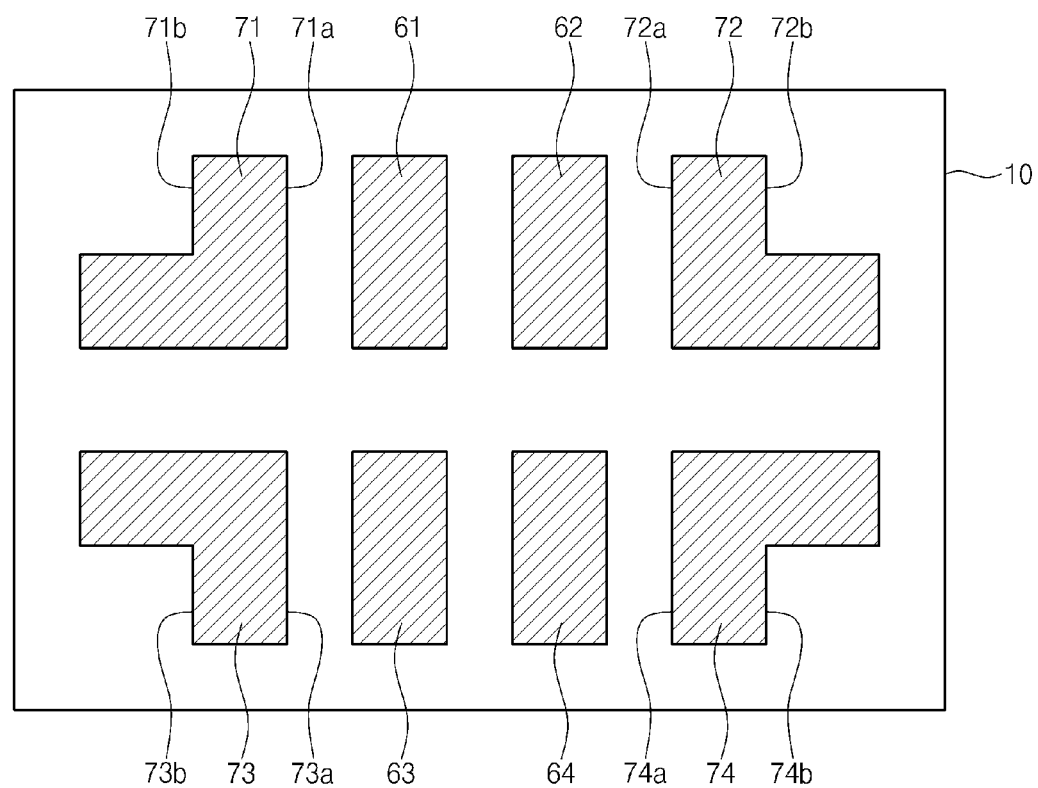

FIG. 2A is an enlarged perspective view of an array resistor that corresponds to a portion A of FIG. 1 according to one embodiment (e.g., Embodiment 1) of the inventive concept. FIGS. 2B to 2E are cross-sectional views of the array resistor, which are respectively taken along lines I-I', II-II', and III-III' of FIG. 2A according to Embodiment 1 of the inventive concept. FIG. 2F is a plan view of pads disposed on a substrate and bonded to the array resistor according to Embodiment 1 of the inventive concept.

Referring to FIGS. 2A to 2E, the second array resistor 15 is disposed on the substrate 10. The second array resistor 15 includes an insulating substrate 20. The insulating substrate 20 may have, for example, a hexahedral shape. The insulating substrate 20 may include a top surface 21, a bottom surface 23, and side surfaces 25a, 25b, 25c, and 25d connecting the top and bottom surfaces 21 and 23 to each other. The side surfaces 25a, 25b, 25c, and 25d may be first to fourth side surfaces 25a, 25b, 25c, and 25d. The first side surface 25a may be opposite the third side surface 25c, and the second side surface 25b may be opposite the fourth side surface 25d. The insulating substrate 20 may be formed, for example, of aluminum oxide ($Al_2O_3$). Aluminum oxide typically has self-insulating properties, high stability against a temperature change, and very high thermal-conductivity.

The second array resistor 15 may include central electrodes and edge electrodes. The central electrodes may include first to eighth central electrodes 31, 32, 33, 34, 35, 36, 37, and 38. Each of the first to fourth central electrodes 31, 32, 33, and 34 and each of the fifth to eighth central electrodes 35, 36, 37, and 38 may be correspondingly disposed opposite each other. In detail, the first to fourth central electrodes 31, 32, 33, and 34 may be spaced apart from each other in one direction (e.g., along a direction of a longer side of the second array resistor 15 and insulating substrate 20) and may be disposed adjacent to the second side surface 25b of the insulating substrate 20. The fifth to eighth central electrodes 35, 36, 37, and 38 may be spaced apart from each other in one direction (e.g., along a direction of a longer side of the second array resistor 15 and insulating substrate 20, which may be the same direction along which the first to fourth central electrodes 31, 32, 33, and 34 are arranged), and may be disposed adjacent to the fourth side surface 25d of the insulating substrate 20. Thus, the first central electrode 31 may be opposite the fifth central electrode 35, the second central electrode 32 may be opposite the sixth central electrode 36, the third central electrode 33 may be opposite the seventh central electrode 37, and the fourth central electrode 34 may be opposite the eighth central electrode 38. Each of the first to eighth central electrodes may be referred to as long-edge electrodes, as they are disposed along a long edge, or long side of the second array resistor 15 and insulating substrate 20. Certain groupings of these electrodes may also be referred to as sets of electrodes. For example, the electrodes 31, 32, 33, and 34 may be referred to as a set of electrodes (e.g., a first set of electrodes compared to electrodes 35, 36, 37, and 38), and the electrodes 35, 36, 37, and 38 may be referred to as a set of electrodes (e.g., a second set of electrodes compared to electrodes 31, 32, 33, and 34).

Each of the first to eighth central electrodes 31, 32, 33, 34, 35, 36, 37, and 38 may include a respective first top surface electrode 31a, 32a, 33a, 34a, 35a, 36a, 37a, and 38a, a respective first side surface electrode 31b, 32b, 33b, 34b, 35b, 36b, 37b, and 38b, and a respective first bottom surface electrodes 31c, 32c, 33c, 34c, 35c, 36c, 37c, and 38c. The first top surface electrodes 31a, 32a, 33a, 34a, 35a, 36a, 37a, and 38a may be disposed on the top surface 21 of the insulating substrate 20, and the first bottom surface electrodes 31c, 32c, 33c, 34c, 35c, 36c, 37c, and 38c may be disposed on the bottom surface 23 of the insulating substrate 20. The first side surface electrodes 31b, 32b, 33b, 34b, 35b, 36b, 37b, and 38b may be disposed on the side surfaces 25b and 25d of the insulating substrate 20 to connect each of the first top surface electrodes 31a, 32a, 33a, 34a, 35a, 36a, 37a, and 38a to each of the first bottom surface electrodes 31c, 32c, 33c, 34c, 35c, 36c, 37c, and 38c. In detail, the first side surface electrodes 31b, 32b, 33b, and 34b of the first to fourth central electrodes 31, 32, 33, and 34 may be disposed on the second side surface 25b of the insulating substrate 20. The first side surface electrodes 35b, 36b, 37b, and 38b of the fifth to eighth central electrodes 35, 36, 37, and 38 may be disposed on the fourth side surface 25d of the insulating substrate 20.

Each central electrode may therefore include three portions integrally formed together in a C-shape, or cup-shape when viewed from a perspective view. Thus, each central electrode may cover three connected surfaces of the insulating substrate 20 and may include three portions—one on a bottom surface of the insulating substrate 20, one portion on a side surface of the insulating substrate 20, and one on a top surface of the insulating substrate 20, so that each central electrode extends from a bottom surface of the insulating substrate 20 to a top surface of the insulating substrate 20.

The end electrodes may include first to fourth end electrodes 41, 42, 43, and 44. The first and third end electrodes 41 and 43 may be spaced apart from each other and disposed adjacent to the first side surface 25a (e.g., along a direction of a shorter side of the second array resistor 15 and insulating substrate 20). The second and fourth edge electrodes 42 and 44 may be spaced apart from each other and disposed adjacent to the third side surface 25c (e.g., along a direction of a shorter side of the second array resistor 15 and insulating substrate 20, which may be the same direction along which the first and third end electrodes 41 and 43 are arranged). Each of the first to fourth end electrodes 41, 42, 43, and 44 may include a respective second top surface electrode 41a, 42a, 43a, and 44a, a respective second side surface electrode 41b, 42b, 43b, and 44b, and a respective second bottom surface electrode 41c, 42c, 43c, and 44c. Each of the second top surface electrodes 41a, 42a, 43a, and 44a may be disposed on the top surface 21 of the insulating substrate 20, and each of the second bottom surface electrodes 41c, 42c, 43c, and 44c may be disposed on the bottom surface 23 of the insulating substrate 20. Each of second side surface electrodes 41b, 42b, 43b, and 44b may be disposed on the first side surface 25a of the insulating substrate 20 to connect each of the second top surface electrodes 41a, 42a, 43a, and 44a to each of the second bottom surface electrodes 41c, 42c, 43c, and 44c. The second side surface electrodes 41b and 43b of the first and third end electrodes 41 and 43 may be disposed on the first side surface 25a of the insulating substrate 20, and the second side surface electrodes 42b and 44b of the second and fourth end electrodes 42 and 44 may be disposed on the third side surface 25c of the insulating substrate 20.

Each of the first to fourth end electrodes may be referred to as short-edge electrodes, as they are disposed along a short edge, or short side of the second array resistor 15 and insulating substrate 20. Also, as described above, each end electrode may include three portions integrally formed together in a C-shape, or cup-shape when viewed from a perspective view. Thus, each end electrode may cover three connected surfaces of the insulating substrate 20 and may include three portions—one on a bottom surface of the insulating substrate 20, one portion on a side surface of the insulating substrate 20, and one on a top surface of the insulating substrate 20, so that each end electrode extends from a bottom surface of the insulating substrate 20 to a top surface of the insulating substrate 20

Certain groupings of these electrodes may also be referred to as sets of electrodes. For example, the electrodes 41 and 43 may be referred to as a set of electrodes (e.g., a first set of electrodes compared to electrodes 42 and 44), and the electrodes 42 and 44 may be referred to as a set of electrodes (e.g., a second set of electrodes compared to electrodes 41 and 43). Also, certain electrodes may be referred to as groups of electrodes. For example, electrodes 31-38 may be referred to as a first group of electrodes, and electrodes 41-44 may be referred to as a second group of electrodes.

The second top surface electrode 41a of the first end electrode 41 may contact the first top surface electrode 31a of the first central electrode 31. The second bottom surface electrode 41c of the first end electrode 41 may contact the first bottom surface electrode 31c of the first central electrode 31. The second top surface electrode 42a of the second end electrode 42 may contact the first top surface electrode 34a of the fourth central electrode 34. The second bottom surface electrode 42c of the second end electrode 42 may contact the first bottom surface electrode 34c of the fourth central electrode 34. The second top surface electrode 43a of the third end electrode 43 may contact the first top surface electrode 35a of the fifth central electrode 35. The second bottom surface electrode 43c of the third end electrode 43 may contact the first bottom surface electrode 35c of the fifth central electrode 35. The second top surface electrode 44a of the fourth end electrode 44 may contact the first top surface electrode 38a of the eighth central electrode 38. The second bottom surface electrode 44c of the fourth end electrode 44 may contact the first bottom surface electrode 38c of the eighth central electrode 38. Thus, the first central electrode 31 may be electrically connected to the first end electrode 41, and the fourth central electrode 34 may be electrically connected to the second end electrode 42. Also, the fifth central electrode 35 may be electrically connected to the third end electrode 43. Also, the eighth central electrode 38 may be electrically connected to the fourth end electrode 44. As these respective electrodes contact each other, they may be directly electrical connected. At each corner of the insulating substrate 20, two electrodes may contact each other—one being an end, or short-edge electrode and one being a central, or long-edge electrode. The two contacting electrodes may be together referred to as a corner electrode. As such, the array resistor 15 may be described as including four central electrodes (e.g., 23, 33, 36, and 37), and four corner electrodes (e.g., 31-41, 34-42, 35-43, and 38-44). Also, while the different end and central electrodes 31-38 and 41-44 may each be a continuously formed electrode, each corner electrode may be a non-continuous electrode formed of two separately formed electrodes.

Although not shown, a plating layer may be formed on a surface of each of the first to eighth central electrodes 31, 32, 33, 34, 35, 36, 37, and 38 and each of the first to fourth end electrodes 41, 42, 43, and 44. The plating layer may be constituted, for example, by a plurality of films. In the plating layer of one embodiment, a nickel (Ni) plating layer and a tin (Sn) plating layer may be successively formed. The nickel (Ni) plating layer may be formed so as to improve bonding force between the first to eighth central electrodes 31, 32, 33, 34, 35, 36, 37, and 38 and the insulating substrate 20, and to improve bonding force between the first to fourth end electrodes 41, 42, 43, and 44, and the insulating substrate 20. In one embodiment, the electrodes 31-38 and 41-44 are formed of silver. A tin (Sn) plating layer may be formed to bond the electrodes 31-38 and 41-44, and thus the second array resistor 15 to the substrate 10, for example, by using a solder 57 that bonds to the tin (Sn) plating layer.

Resistors 51 may be disposed on the insulating substrate 20. Referring to FIGS. 2A, 2D, and 2E, each of the resistors 51 may have a bar shape and be disposed in a space between respective ends of each of the first to eighth central electrodes 31, 32, 33, 34, 35, 36, 37, and 38 opposite each other. In detail, a resistor 51 may be disposed in a space between the first central electrode 31 and the fifth central electrode 35, another resistor 51 may be disposed in a space between the second central electrode 32 and the sixth central electrode 36, another resistor 51 may be disposed in a space between the third central electrode 33 and the seventh central electrode 37, and another resistor 51 may be disposed in a space between the fourth central electrode 34 and the eighth central electrode 38. As illustrated in FIG. 2D, in one embodiment, each resistor 51 may be disposed on the top surface 21 of the insulating substrate 20. As illustrated in FIG. 2E, in another embodiment, each resistor 51 may be disposed on the bottom surface 23 of the insulating substrate 20.

The resistor 51 may include a cutoff part 53, and thus may have a bar shape with a portion removed therefrom. For example, portion of a resistor 51 may be cut and removed by using a laser through a trimming process to define the cutoff part 53. The trimming process may be a process resulting in a plurality of resistors 51 disposed on the second array resistor 15 having the same resistance. For example, each of the resistors 51 that are initially formed on the insulating substrate 20 may be in a state where the some of the different resistors 51 do not have desired resistance. For example, the resistors 51 may have resistances different from each other. Thus, the trimming process may be performed to cut a portion of the resistors 51 to increase a resistance of certain resistors 51, thereby setting a desired resistance. In one embodiment, each resistor 51 may include ruthenium oxide (RuO).

A protective film 55 may be disposed on the resistor 51. As illustrated in FIG. 2D, in one embodiment, when the resistor 51 is disposed on the top surface 21 of the insulating substrate 20, the protective film 55 may cover the resistor 51 on the top surface 21 of the insulating substrate 20. The resistor 51 may be positioned between the protective film 55 and the insulating substrate 20. As illustrated in FIG. 2E, in one embodiment, when the resistor 51 is disposed on the bottom surface 23 of the insulating substrate 20, the protective film 55 may cover the resistor 51 on the bottom surface 23 of the insulating substrate 20. The resistor 51 may be positioned between the protective film 55 and the insulating substrate 20. In one embodiment, the protective film 55 may be formed of silicon oxide ($SiO_2$) or a glass-coated material.

The second array resistor 15 may be bonded to the substrate 10, for example, by using a shape-transformable, non-planar bonding material such as the solder 57. The solder 57 may have, for example, a sloped shape and may have three edges when viewed from a cross-sectional view—two of which may be straight, and one curved. In one embodiment, the second array resistor 15 is mounted on the substrate 10 so that the first bottom surface electrodes 31c, 32c, 33c, 34c, 35c, 36c, 37c, and 38c and the second bottom surface electrodes 41c, 42c, 43c, and 44c disposed on the bottom surface 23 of the insulating substrate 20 are in contact with the pads disposed on the top surface 21 of the substrate 10. After the second array resistor 15 is mounted on the substrate 10, a soldering process may be performed thereto. Thus, each of the first side surface electrodes 31b, 32b, 33b, 34b, 35b, 36b, 37b, 38b, and each of the second side surface electrodes 41b, 42b, 43b, and 44b, may be bonded to a pad disposed on the top surface 21 of the substrate 10 by using the molten solder 57. Thus, in this manner, the second array resistor 15 may be bonded to the substrate 10.

Referring to FIG. 2F, each of the pads on the top surface 21 of the substrate 10 may correspondingly contact each of the first bottom surface electrodes 31c, 32c, 33c, 34c, 35c, 36c, 37c, and 38c and each of the second bottom surface electrodes 41c, 42c, 43c, and 44c. For example, the pads may include first to fourth central pads 61, 62, 63, and 64 and first to fourth end pads 71, 72, 73, and 74, also referred to as corner pads. The pads on the top surface 21 of the substrate 10 may also be referred to herein as board pads, or module pads. The first to fourth central pads 61, 62, 63, and 64 may be arranged in a 2×2 matrix form. The first and second central pads 61 and 62 may be in contact with the first bottom surface electrodes 32c and 33c of the second and third central electrodes 32 and 33. The third and fourth central pads 63 and 64 may be in contact with the first bottom surface electrodes 36c and 37c of the sixth and seventh central electrodes 36 and 37. The first central pad 61 may face the third central pad 63 in a row direction and face the second central pad 62 in a column direction (e.g., side edges may thereof may face each other). The fourth central pad 64 may face the second central pad 62 in a row direction and face the third central pad 63 in a column direction (e.g., side edges may thereof may face each other).

The first end pad 71 may be disposed at one side of the first central pad 61, and the second end pad 72 may be disposed at the other side of the second central pad 62. The third end pad 73 may be disposed at one side of the third central pad 63, and the fourth end pad 74 may be disposed at the other side of the fourth central pad 64. Thus, the first and second central pads 61 and 62 may be disposed on the substrate 10 between first and the second end pads 71 and 72, and the third and fourth central pads 63 and 64 may be disposed on the substrate 10 between the third and fourth end pads 73 and 74.

A top edge (when viewed from a plan view) of the first end pad 71 may be disposed at the same level as those of the first and second central pads 61 and 62 and second end pad 72. Also, a bottom edge of the first end pad 71 may be disposed at the same level as those of the first and second central pads 61 and 62 and second end pad 72.

A top edge of the third end pad 73 may be disposed at the same level as those of the third and fourth central pads 63 and 64 and fourth end pad 74. Also, a bottom edge of the third end pad 73 may be disposed at the same level as those of the third and fourth central pads 63 and 64 and fourth end pad 74.

The first end pad 71 may include a first edge 71a adjacent to the first central pad 61 and a second edge 71b opposite the first surface 71a. The second edge 71b of the first end pad 71 may have a protruding lower portion. Thus, when a distance between the first and second edges 71a and 71b of the first end pad 71 is defined as a width of the first end pad 71, the first end pad 71 may have a lower portion having a width greater than that of an upper portion of the first end pad 71. The first end pad 71 may contact both the first bottom surface electrode 31c of the first central electrode 31 and the second bottom surface electrode 41c of the first end electrode 41. The first end pad 71 may have, for example, a bent or angled shape, such as an L shape, when viewed from a plan view.

The second end pad 72 may include a first edge 72a adjacent to the second central pad 62 and a second edge 72b facing the first surface 72a. The second edge 72b of the second end pad 72 may have a protruding lower portion. Thus, when a distance between the first and second edges 72a and 72b of the second end pad 72 is defined as a width of the second end pad 72, a lower portion of the second end pad 72 may have a width greater than that of an upper portion of the second end pad 72. The second end pad 72 may contact both the first bottom surface electrode 34c of the fourth central electrode 34 and the second bottom surface electrode 42c of the second end electrode 42. The second end pad 72 may have, for example, a bent or angled shape, such as an L shape, when viewed from a plan view The third end pad 73 may include a first edge 73a adjacent to the third central pad 63 and a second edge 73b opposite the first surface 73a. The second edge 74b of the third end pad 73 may have a protruding upper portion. Thus, when a distance between the first and second edges 74a and 72b of the third end pad 73 is defined as a width of the third end pad 73, an upper portion of the third end pad 73 may have a width greater than that of a lower portion of the third end pad 73. The third end pad 73 may contact both the first bottom surface electrode 35c of the fifth central electrode 35 and the second bottom surface electrode 43c of the third end electrode 43. The third end pad 73 may have, for example, a bent or angled shape, such as an L shape, when viewed from a plan view The fourth end pad 74 may include a first edge 74a adjacent to the fourth central pad 64 and a second edge 74b opposite the first edge 74a. The second edge 74b of the fourth end pad 74 may have a protruding upper portion. Thus, when a distance between the first and second edge 74a and 74b of the fourth end pad 74 is defined as a width of the fourth end pad 74, an upper portion of the fourth end pad 74 may have a width greater than that of a lower portion of the fourth end pad 74. The fourth end pad 74 may contact both the first bottom surface electrode 38c of the eighth central electrode 38 and the second bottom surface electrode 44c of the fourth end electrode 44. The fourth end pad 74 may have, for example, a bent or angled shape, such as an L shape, when viewed from a plan view As can be seen, each substrate pad (61-64 and 71-74) may both contact a bottom surface electrode of the second array resistor 15 and be bonded to a side surface electrode of the second array resistor 15, for example using a solder. Certain substrate pads, such as corner pads 71-74 may each contact two bottom surface electrodes and be bonded separately to two side surface electrodes of the second array resistor 15, for example, using two different solders. This may improve a bonding strength between the second array resistor 15 and the module board 10.

The second array resistors 15 disposed on the second part 12b of the chip area 12 may be more directly affected by external impact than the first array resistors 13 disposed on the first part 12a of the chip area 12. Since the first array resistors 13 are disposed on the substrate 10 between semiconductor chips of the plurality of semiconductor chips, the first array resistors 13 are protected by the semiconductor chips 11. However, since the second array resistors 15 are disposed on the edge area of the substrate 10, the second array resistors 15 may receive more of the external impact, particularly if they are not covered by the protective film 55. Thus, when a handling process of an assembling process is performed, a bonding defect may occur. Particularly, a lot of bonding defects may occur on the second array resistors 15 disposed on an edge portion of the second part 12b of the chip area 12. Therefore, in certain embodiments, in order to increase bonding force of the second array resistor 15 to the substrate 10, the first and third end electrodes 41 and 43 spaced from each other may be disposed on the first side surface 25a of the insulating substrate 20, and the second and fourth end electrodes 42 and 44 spaced apart from each other may be disposed on the third side surface 25c opposite the first side surface 25a. The first to fourth end electrodes 41, 42, 43, and 44, in addition to the first to eighth central electrodes 31-38 may be bonded to the substrate 10 by using the solder 57. Thus, the substrate 10 may increase in bonding force while an existing area of the array resistor is maintained to improve yield of the semiconductor memory module 1.

Figure 3A:
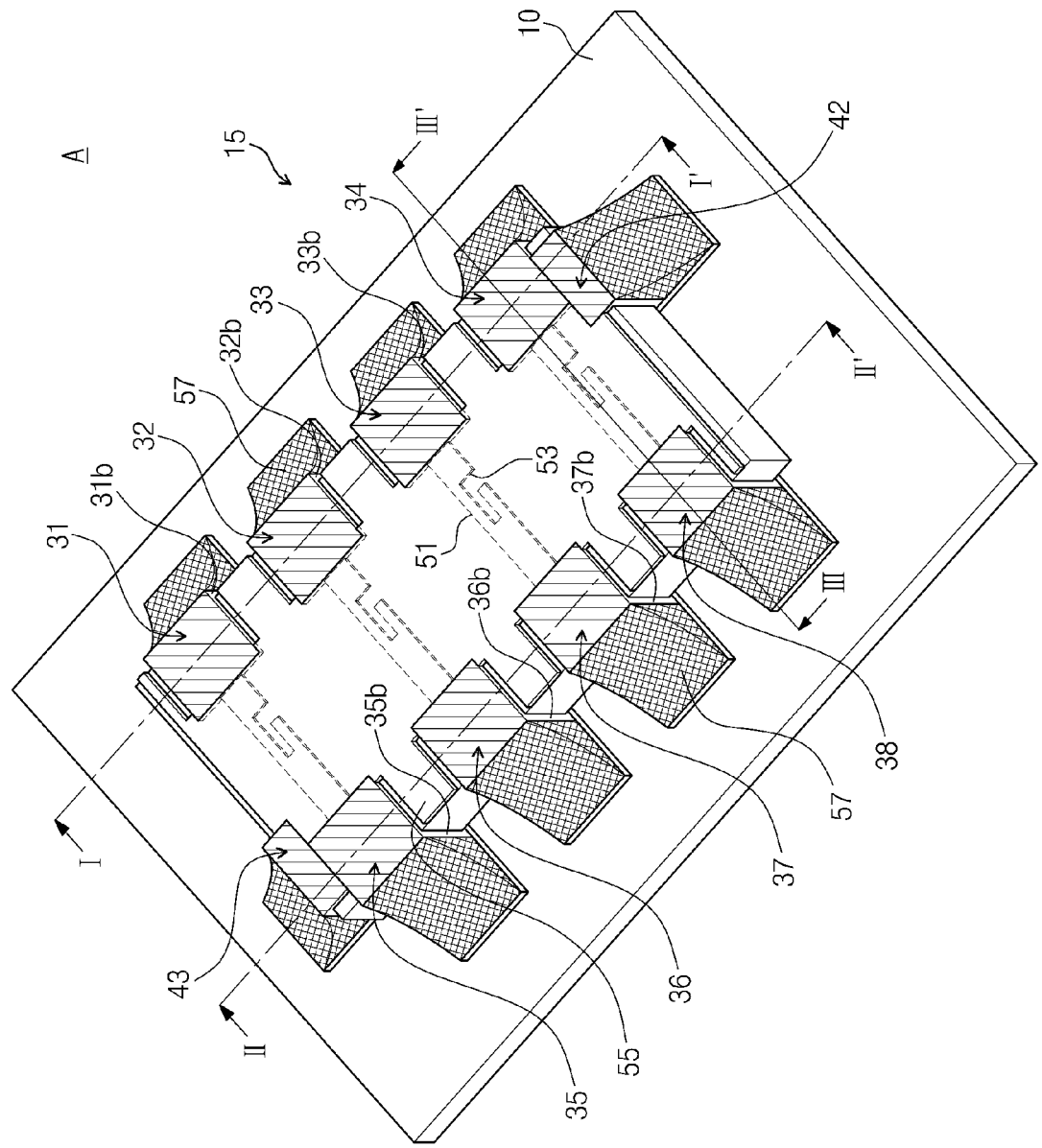
Figure 3B:
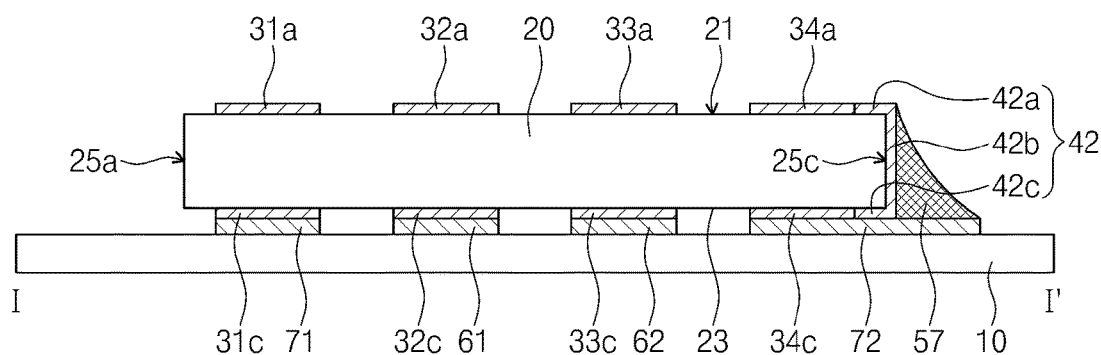
Figure 3C:
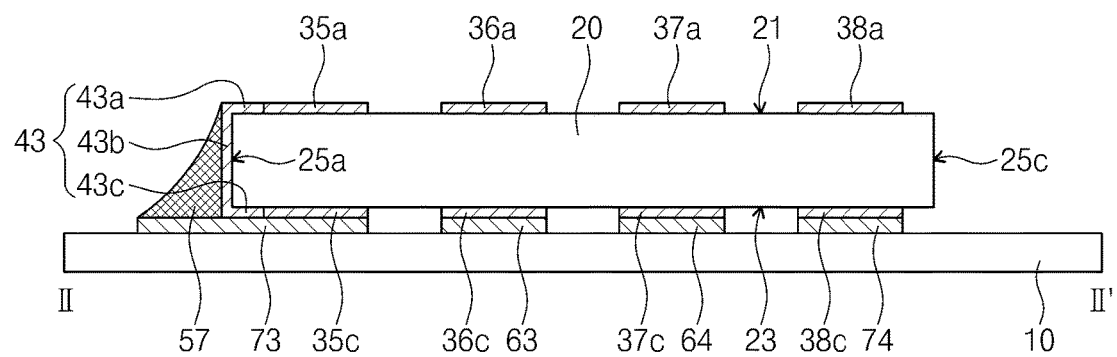
Figure 3D:
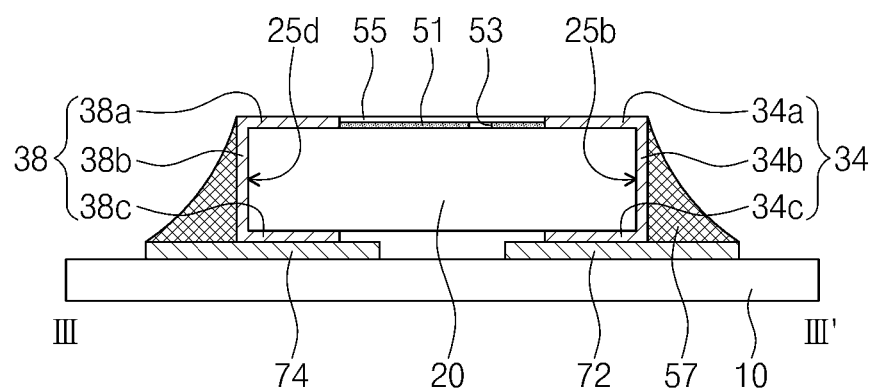
Figure 3E:
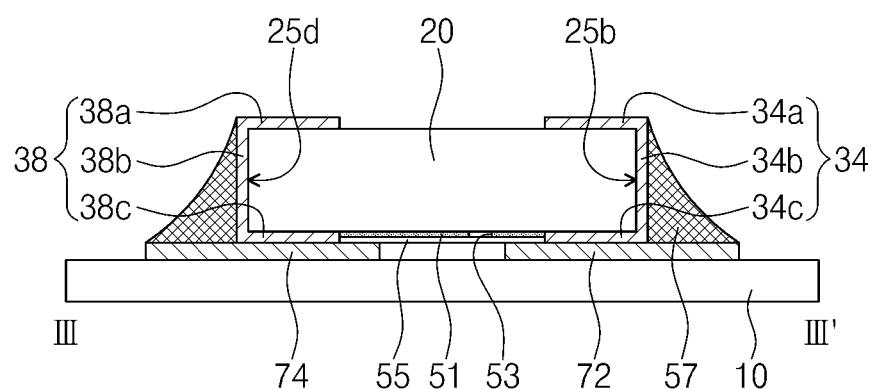
Figure 3F:
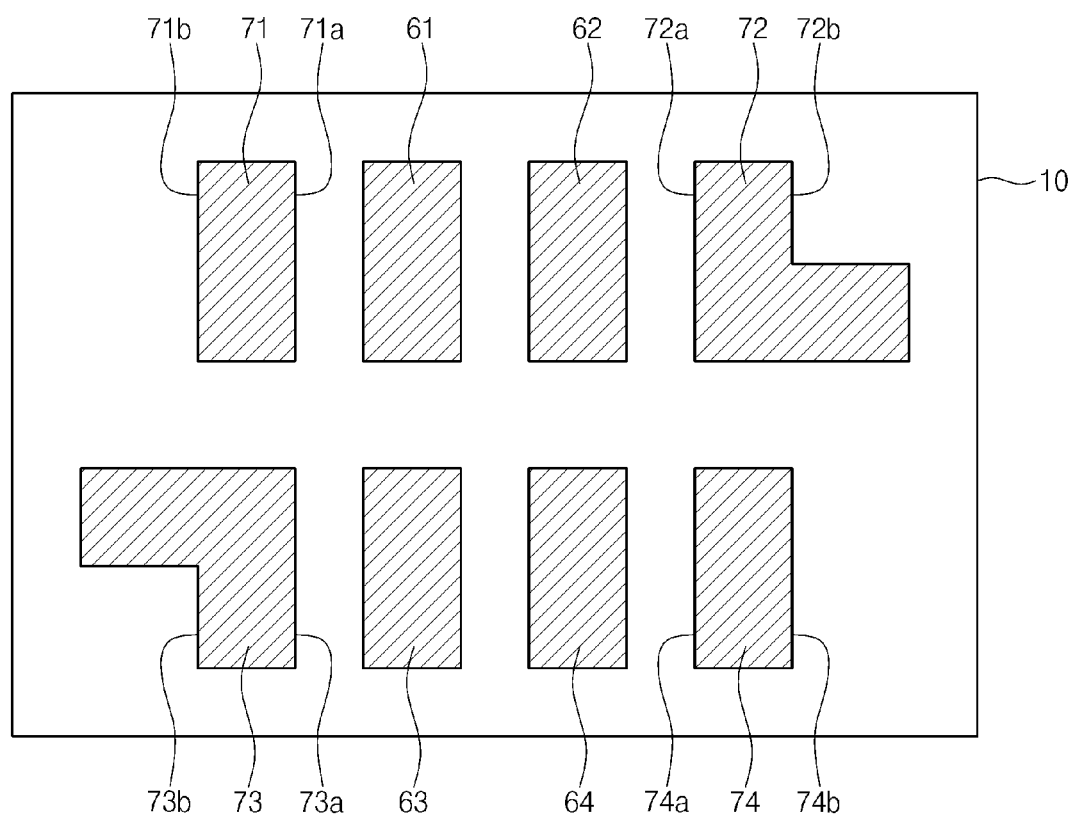

FIG. 3A is an enlarged perspective view of an array resistor that corresponds to a portion A of FIG. 1 according to Embodiment 2 of the inventive concept. FIGS. 3B to 3E are exemplary cross-sectional views of the array resistor, which are respectively taken along lines I-I', II-II', and III-III' of FIG. 3A according to Embodiment 2 of the inventive concept. FIG. 3F is an exemplary plan view of pads disposed on a substrate bonded to the array resistor according to Embodiment 2 of the inventive concept.

For brief description, in Embodiment 2 illustrated in FIGS. 3A to 3F, substantially the same components as Embodiment 1 will be represented by the same reference numerals, and thus their detailed descriptions will be omitted.

Referring to FIGS. 3A to 3F, a second array resistor 15 may include first to eighth central electrodes 31, 32, 33, 34, 35, 36, 37, and 38 and second and third end electrodes 42 and 43. Each of the second and third end electrodes 42 and 43 may include each of second top surface electrodes 42a and 43a, each of second side surface electrodes 42b and 43b, and each of second bottom surface electrodes 42c and 43c. The second side surface electrode 42b of the second end electrode 42 may be disposed on a third side surface 25c of an insulating substrate 20, and the second side surface electrode 43b of the third end electrode 43 may be disposed on a first side surface 25a of the insulating substrate 20. A first top surface electrode 34a of the fourth central electrode 34 may contact and be electrically connected to the second top surface electrode 42a of the second end electrode 42. A first top surface electrode 35a of the fifth central electrode 35 may contact and be electrically connected to the second top surface electrode 43a of the third end electrode 43.

The first end pad 71 may have upper and lower portions having the same width. The first end pad 71 may be in contact with a first bottom surface electrode 31c of the first central electrode 31. The fourth end pad 74 may have upper and lower portions having the same width. The fourth end pad 74 may be in contact with a first bottom surface electrode 38c of the eighth central electrode 38.

The second end pad 72 may include a first edge 72a adjacent to a fourth central pad 64 and a second edge 72b opposite the first edge 72a. The second edge 72b of the second end pad 72 may have a protruding lower portion. Thus, a lower portion of the second end pad 72 may have a width greater than that of an upper portion of the second end pad 72. The second end pad 72 may contact both a first bottom surface electrode 34c of the fourth central electrode 34 and the second bottom surface electrode 42c of the second end electrode 42.

The third end pad 73 may include a first edge 73a adjacent to a third central pad 63 and a second edge 73b opposite the first edge 73a. The second edge 73b of the third end pad 73 may have a protruding upper portion. Thus, the upper portion of the third end pad 73 may have a width greater than that of a lower portion thereof. The third end pad 73 may contact both a first bottom surface electrode 35c of the fifth central electrode 35 and the second bottom surface electrode 43c of the third end electrode 43.

Figure 4A:
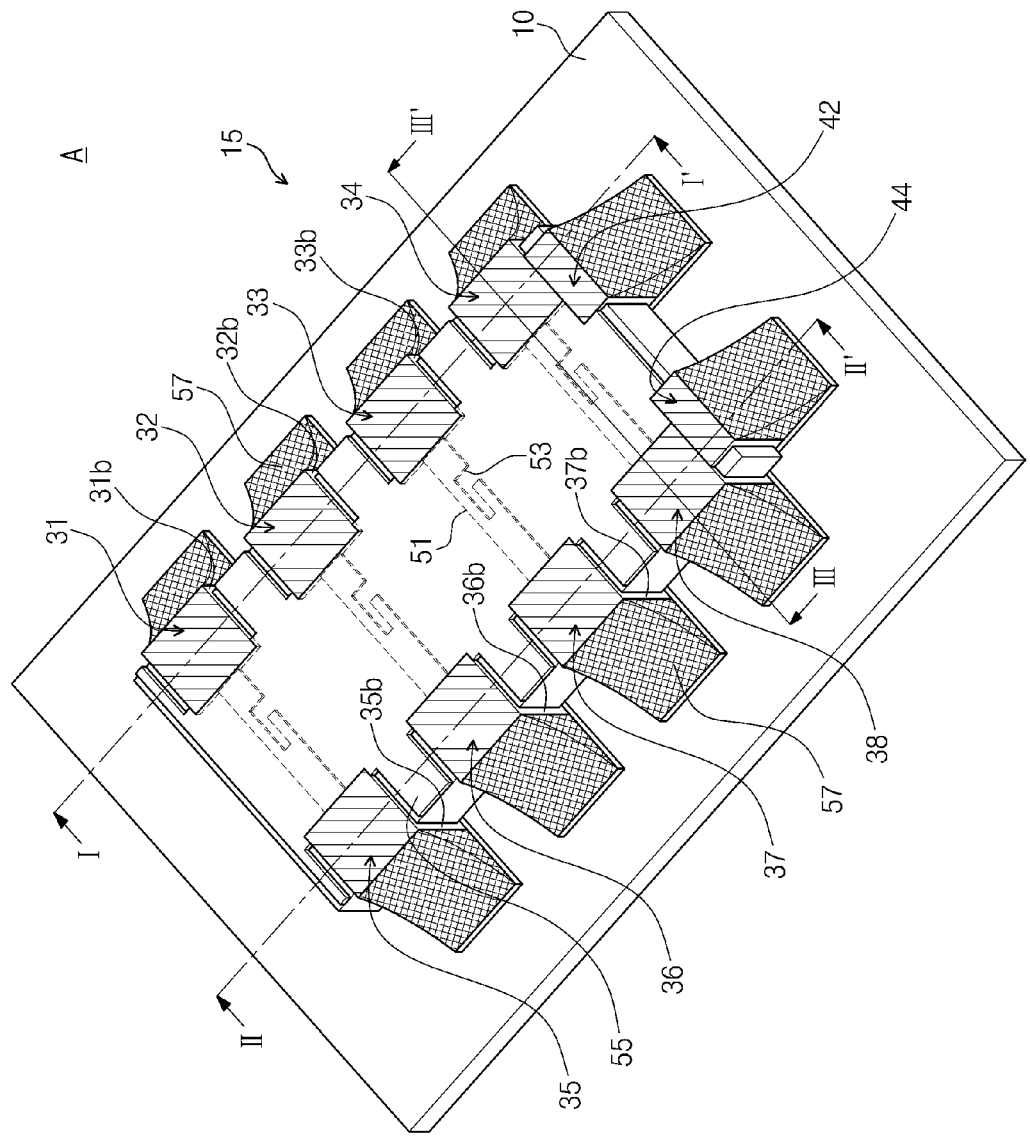
Figure 4B:
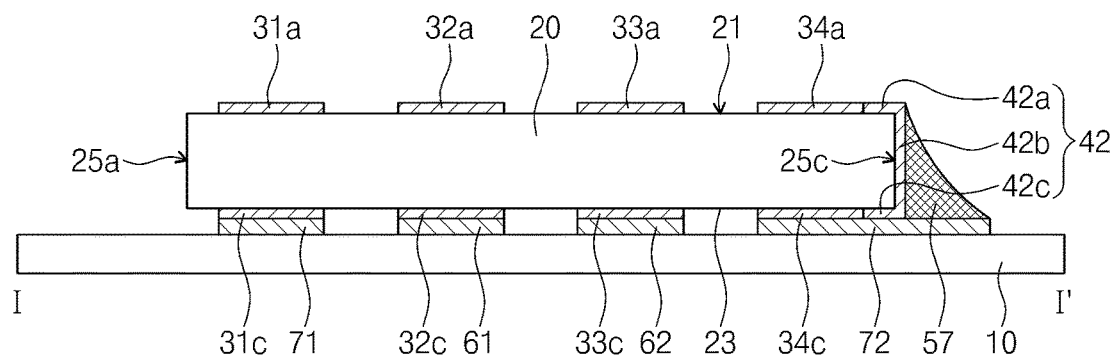
Figure 4C:
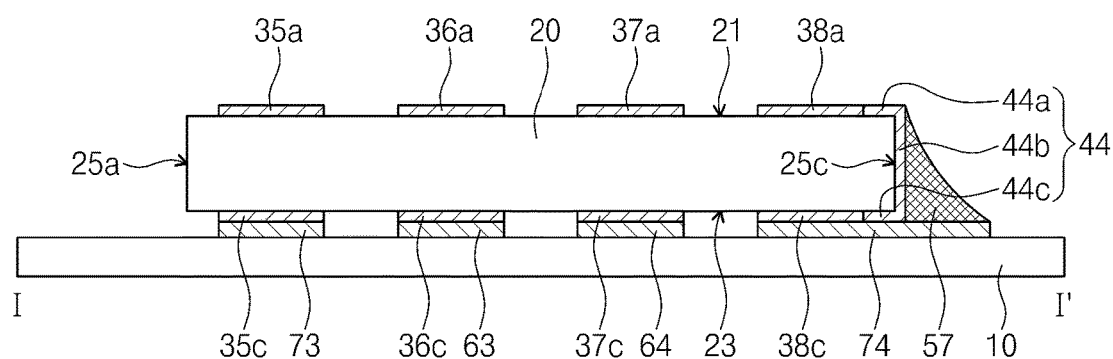
Figure 4D:
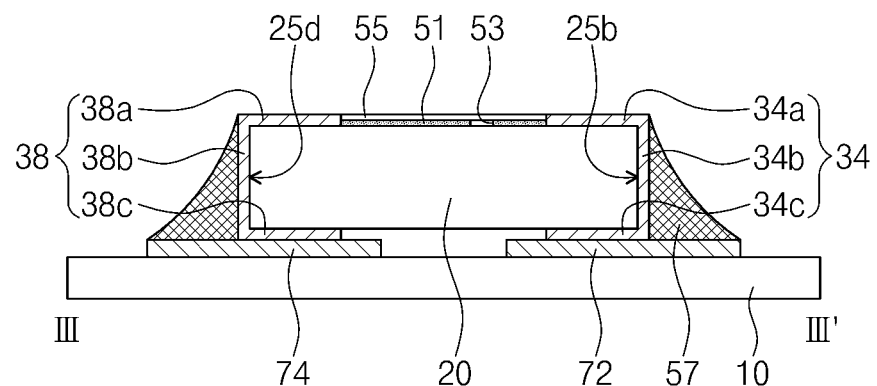
Figure 4E:
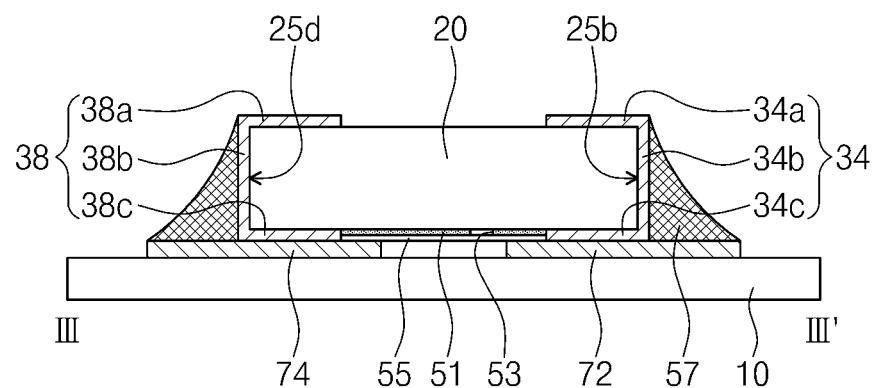
Figure 4F:
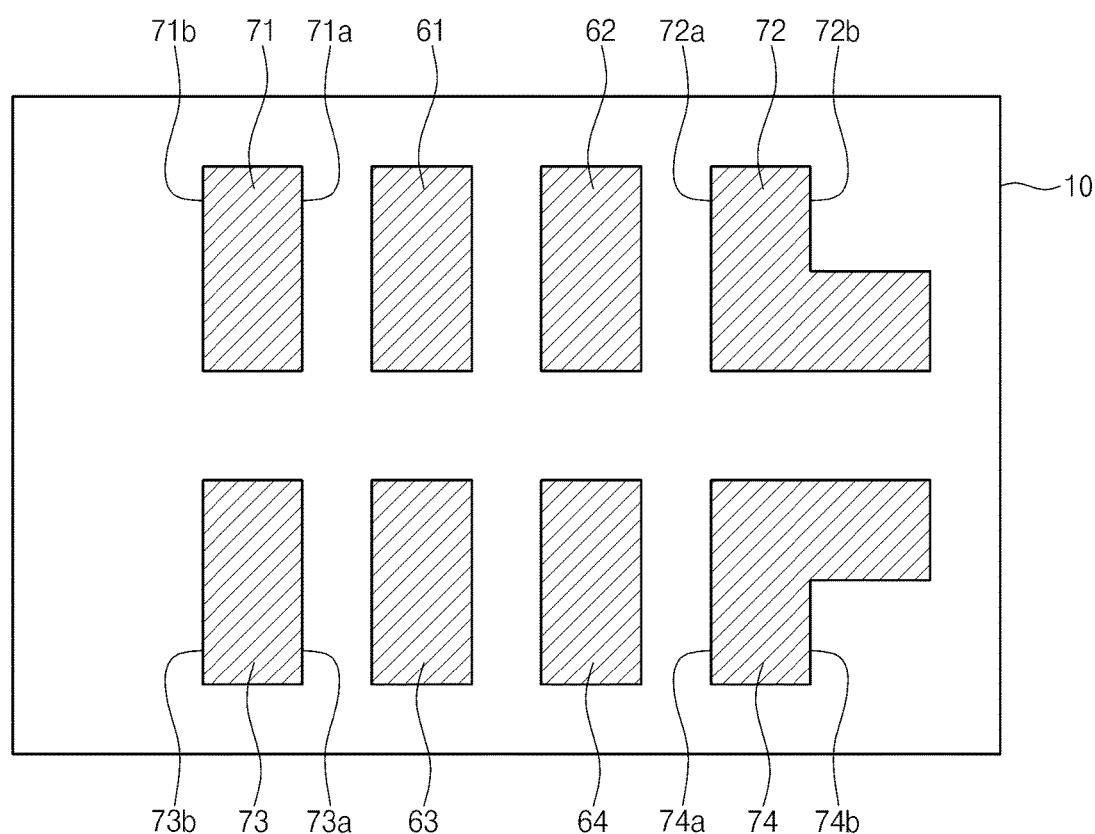

FIG. 4A is an enlarged perspective view of an array resistor that corresponds to a portion A of FIG. 1 according to Embodiment 3 of the inventive concept. FIGS. 4B to 4E are cross-sectional views of the array resistor, which are respectively taken along lines I-I', II-II', and III-III' of FIG. 4A according to Embodiment 3 of the inventive concept. FIG. 4F is a plan view of pads disposed on a substrate bonded to the array resistor according to Embodiment 3 of the inventive concept.

For brief description, in Embodiment 3 illustrated in FIGS. 4A to 4F, substantially the same components as Embodiment 1 will be represented by the same reference numerals, and thus their detailed descriptions will be omitted.

Referring to FIGS. 4A to 4F, a second array resistor 15 may include first to eighth central electrodes 31, 32, 33, 34, 35, 36, 37, and 38 and second and fourth end electrodes 42 and 44. The second end electrode 42 may include a second top surface electrode 42a, a second side surface electrode 42b, and a second bottom surface electrode 42c. The second side surface electrode 42b of the second end electrode 42 may be disposed on a third side surface 25c of an insulating substrate 20. A second top surface electrode 42a of the second end electrode 42 may contact and be electrically connected to a first top surface electrode 34a of the fourth central electrode 34.

The fourth end electrode 44 may include a second top surface electrode 44a, a second side surface electrode 44b, and a second bottom surface electrode 44c. The second side surface electrode 44b of the fourth end electrode 44 may be spaced apart from the second side surface electrode 42b of the second end electrode 42 on a third side surface 25c of an insulating substrate 20. A second top surface electrode 44a of the fourth end electrode 44 may contact and be electrically connected to a first top surface electrode 38a of the eighth central electrode 38.

The second edge 72b of the second end pad 72 may have a protruding lower portion. Thus, a lower portion of the second end pad 72 may have a width greater than that of an upper portion thereof. The second end pad 72 may contact a first bottom surface electrode 34c of the fourth central electrode 34 and the second bottom surface electrode 42c of the second end electrode 42 at the same time. The first end pad 71 may have upper and lower portions having the same width. The first end pad 71 may have the same width as that of the upper portion of the second end pad 72. The first end pad 71 may be in contact with a first bottom surface electrode 31c of the first central electrode 31.

A second edge 74b of the fourth end pad 74 may have a protruding upper portion. Thus, an upper portion of the fourth end pad 74 may have a width greater than that of a lower portion thereof. The fourth end pad 74 may contact a first bottom surface electrode 38c of the eighth central electrode 38 and the second bottom surface electrode 44c of the fourth end electrode 44 at the same time. The third end pad 73 may have the same width as that the lower portion of the fourth end pad 74. The third end pad 73 may be in contact with a first bottom surface electrode 34c of the fourth central electrode 34.

Thus, based on the different embodiments described above, when any devices or chips are disposed adjacent to the first to fourth end electrodes 41, 42, 43, and 44 of the second array resistor 15 on the substrate 10, the first to fourth end electrodes 41, 42, 43, and 44 may be selectively disposed on the second array resistor 15. Although the second array resistor 15 on which the first and fourth end electrodes 41 and 44 are not disposed is illustrated in the drawing, only one of the second and third end electrodes 42 and 43 may be disposed on the second array resistor 15. Also, when one or more and three or less end electrodes is/are disposed on the array resistor, positions where the end electrodes are disposed on the first to fourth side surfaces 25a, 25b, 25c, and 25d of the insulating substrate 20 are not limited.

Figure 5A:
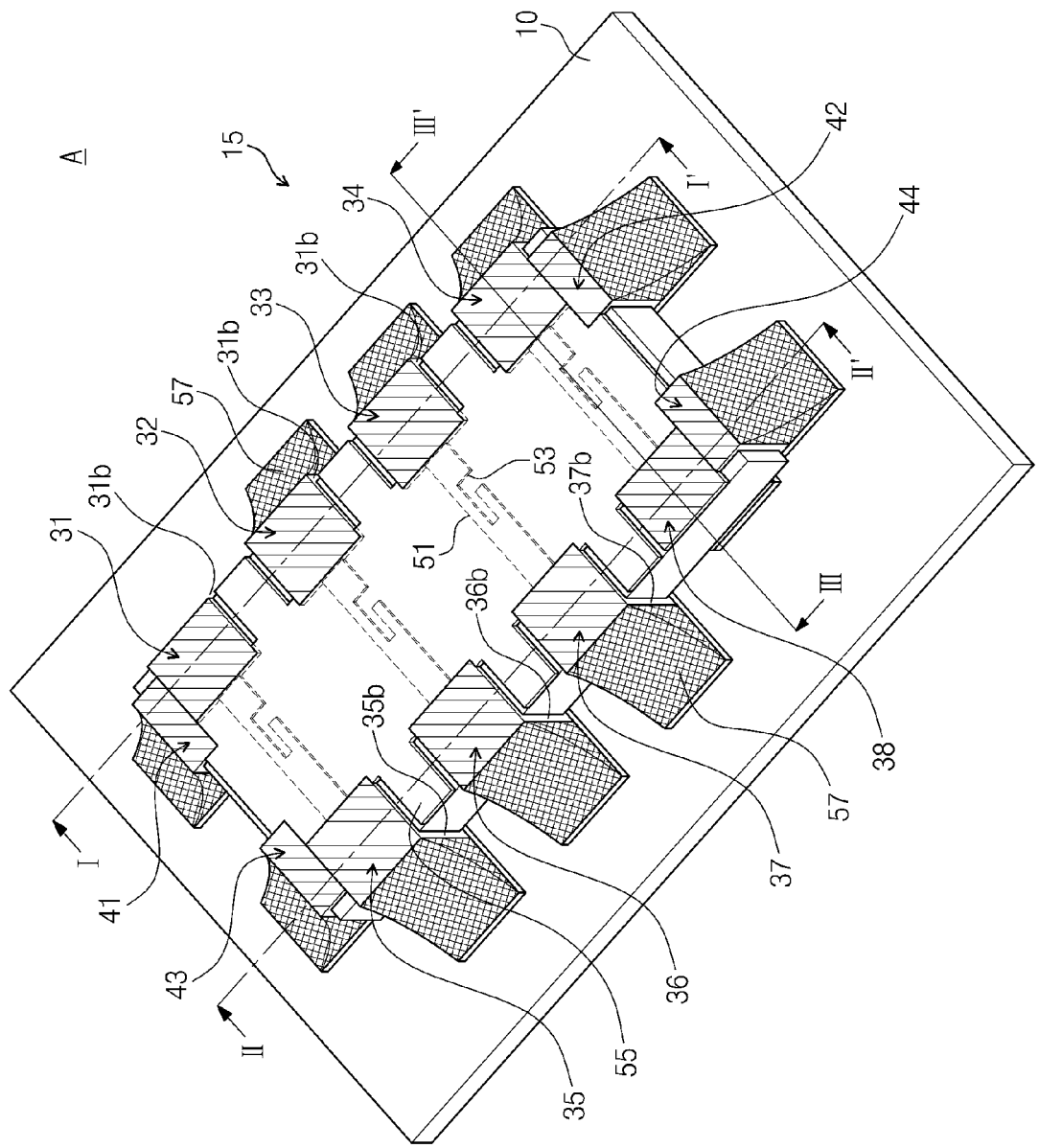
Figure 5B:
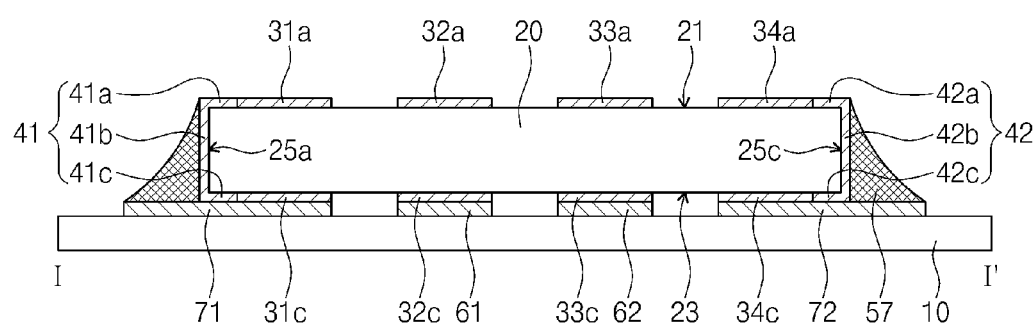
Figure 5C:
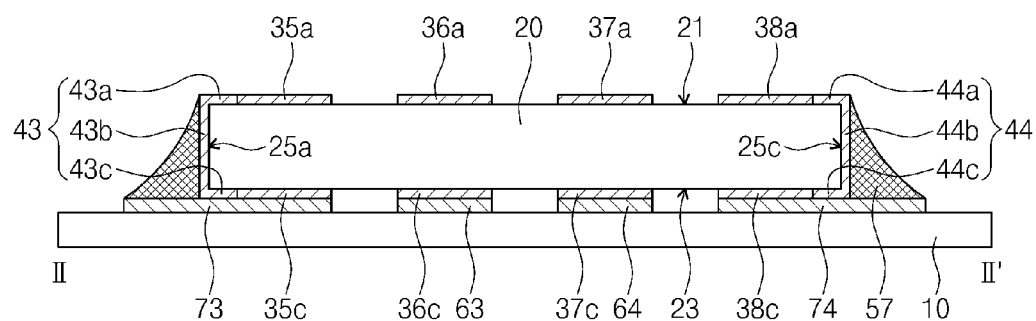
Figure 5D:
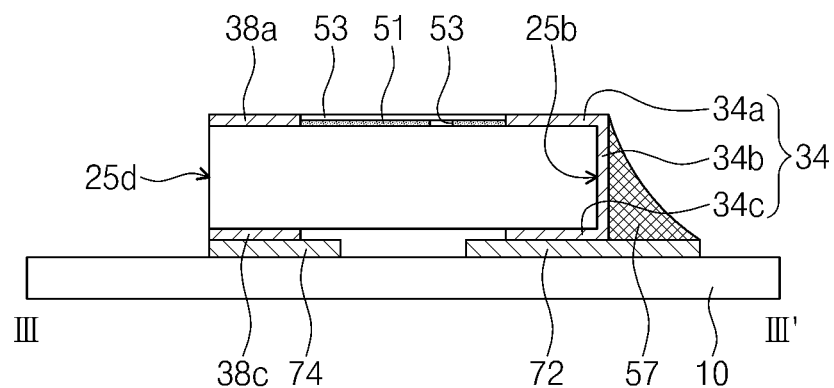
Figure 5E:
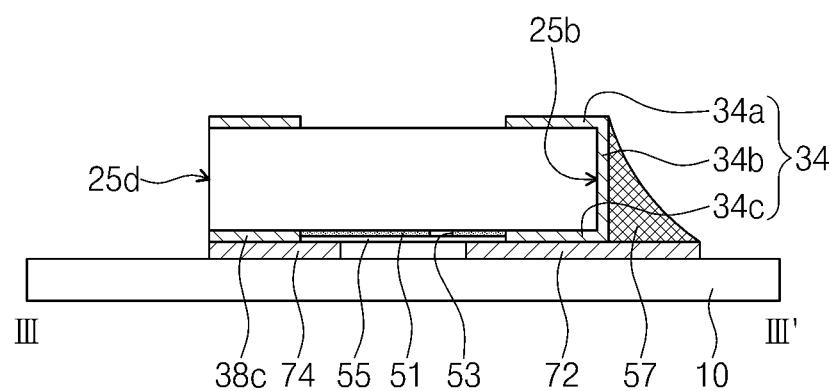
Figure 5F:
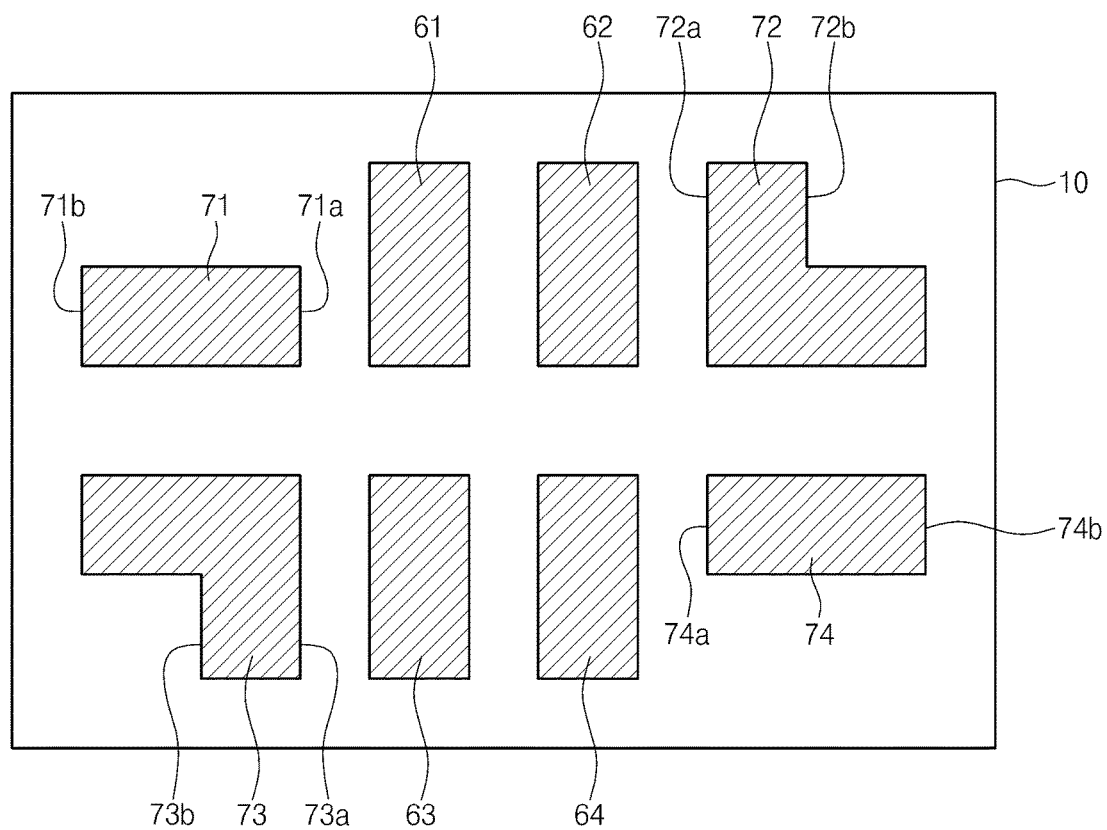

FIG. 5A is an enlarged perspective view of an array resistor that corresponds to a portion A of FIG. 1 according to Embodiment 4 of the inventive concept. FIGS. 5B to 5E are exemplary cross-sectional views of the array resistor, which are respectively taken along lines I-I', II-II', and III-III' of FIG. 5A according to Embodiment 4 of the inventive concept. FIG. 5F is a plan view of pads disposed on a substrate bonded to the array resistor according to Embodiment 4 of the inventive concept.

For brief description, in Embodiment 4 illustrated in FIGS. 5A to 5F, substantially the same component as Embodiment 1 will be represented by the same reference numerals, and thus their detailed descriptions will be omitted.

Referring to FIGS. 5A to 5F, a second array resistor 15 may include first to eighth central electrodes 31, 32, 33, 34, 35, 36, 37, and 38 and first to fourth end electrodes 41, 42, 43, and 44. Each of the second to fourth central electrodes 32, 33, and 34 may include each of first top surface electrodes 32a, 33a, and 34a disposed on a top surface 21 of an insulating substrate 20 and each of first bottom surface electrodes 32c, 33c, and 34c disposed on a bottom surface 23 of the insulating substrate 20. Also, each of the fifth to seventh central electrodes 35, 36, and 37 may include each of first top surface electrodes 35a, 36a, and 37a disposed on the top surface 21 of the insulating substrate 20 and each of first bottom surface electrodes 35c, 36c, and 37c disposed on the bottom surface 23 of the insulating substrate 20. First side surfaces electrodes 32b, 33b, and 34b for connecting each of the first top surface electrodes 32a, 33a, and 34a of the second to fourth central electrodes 32, 33, and 34 to each of the first bottom surface electrodes 32c, 33c, and 34c of the second to fourth central electrodes 32, 33, and 34 may be disposed on a second side surface 25b of the insulating substrate 20. Second side surface electrodes 35b, 36b, and 37b for connecting each of the first top surface electrodes 35a, 36a, and 37a of the fifth to seventh central electrodes 35, 36, and 37 to each of the first bottom surface electrodes 35c, 36c, and 37c of the fifth to seventh central electrodes 35, 36, and 37 may be disposed on a fourth side surface 25d of the insulating substrate 20.

The first central electrode 31 may include the first top surface electrode 31a disposed on the top surface 21 of the insulating substrate 20 and the first bottom surface electrode 31c disposed on the bottom surface 23 of the insulating substrate 20. The first top surface electrode 31a and the first bottom surface electrode 31c of the first central electrode 31 may be spaced apart from each other (e.g., without a side surface electrode connecting the two). The first top surface electrode 31a of the first central electrode 31 may contact and be electrically connected to a second top surface electrode 41a of the first end electrode 41. The first bottom surface electrode 31c of the first central electrode 31 may contact and be electrically connected to a second bottom surface electrode 41c of the first end electrode 41.

The eighth central electrode 38 may include a first top surface electrode 38a disposed on the top surface 21 of the insulating substrate 20 and a first bottom surface electrode 38c disposed on the bottom surface 23 of the insulating substrate 20. The first top surface electrode 38a and the first bottom surface electrode 38c of the eighth central electrode 38 may be spaced apart from each other (e.g., without a side surface electrode connecting the two). The first top surface electrode 38a of the eighth central electrode 38 may contact and be electrically connected to a second top surface electrode 44a of a fourth end electrode 44. The first bottom surface electrode 38c of the eighth central electrode 38 may contact and be electrically connected to a second bottom surface electrode 44c of the fourth end electrode 44.

A second end pad 72 may include a first edge 72a adjacent to a second central pad 62 and a second edge 72b opposite the first surface 72a. The second edge 72b of the second end pad 72 may have a protruding lower portion. Thus, a lower portion of the second end pad 72 may have a width greater than that of an upper portion thereof. A top edge of the second end pad 72 may be disposed at the same level as those of the first and second central pads 61 and 62. Also, a bottom surface of the second end pad 72 may be disposed at the same level as those of the first and second central pads 61 and 62. The second end pad 72 may contact both the first bottom surface electrode 34c of the fourth central electrode 34 and the second bottom surface electrode 42c of the second end electrode 42.

A first end pad 71 may have the same width as that of the lower portion of the second end pad 72. A top edge of the first end pad 71 may be disposed lower than that of the second end pad 72, and a bottom edge of the first end pad 71 may be disposed at the same level that of the second end pad 72. The first end pad 71 may contact both the first bottom surface electrode 35c of the first central electrode 31 and the second bottom surface electrode 41c of the first end electrode 41.

A third end pad 73 may include a first edge 73a adjacent to a third central pad 63 and a second edge 73b facing the first edge 73a. The second surface 73b of the third end pad 73 may have a protruding upper portion. Thus, an upper portion of the third end pad 73 may have a width greater than that of a lower portion thereof. A bottom edge of the third end pad 73 may be disposed at the same level as those of the third and fourth central pads 63 and 64, and a top edge of the third end pad 73 may be disposed at the same level as those of the third and fourth central pads 63 and 64. The third end pad 73 may contact both the first bottom surface electrode 35c of the fifth central electrode 35 and the second bottom surface electrode 43c of the third end electrode 43.

A fourth end pad 74 may have the same width as that of the upper portion of the third end pad 73. A bottom edge of the fourth end pad 74 may be disposed upper than that of the third end pad 73. A top edge of the fourth end pad 74 may be disposed at the same level as the top edge of the third end pad 73. The fourth end pad 74 may contact both the first bottom surface electrode 38c of the eighth central electrode 38 and the second bottom surface electrode 44c of the fourth end electrode 44.

When any devices or chips are disposed on the substrate 10 adjacent to the second array resistor 15, the first to fourth end electrodes 41, 42, 43, and 44 may be disposed on the second array resistor 15, and the first side surface electrodes 31b, 34b, 35b, and 38b of the first, fourth, fifth, and eighth central electrodes 31, 34, 35, and 38 may not be selectively disposed on the second array resistor 15. In the drawing, since the first and eighth central electrodes 31 and 38 do not include the first side surface electrodes 31b and 38b, devices or chips may be disposed on the substrate 10 on an area adjacent to the first and eight central electrodes 31 and 38. Although not shown, one of the fourth and fifth central electrodes 34 and 35 may not include the first bottom surface electrodes 34c and 35c.

Figure 6:
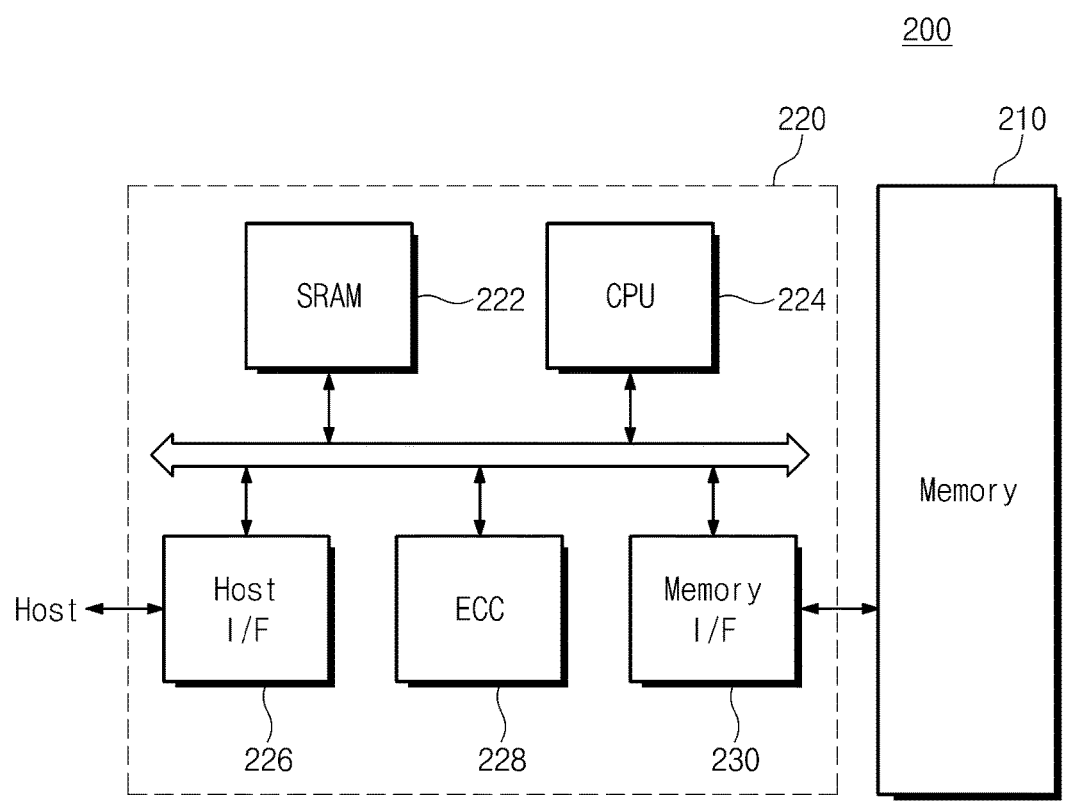
FIG. 6 is a block diagram of a memory card including a semiconductor memory module according to embodiments of the inventive concept.

FIG. 6 is a block diagram of a memory card including a semiconductor memory module according to embodiments of the inventive concept.

Referring to FIG. 6, the semiconductor memory module according to the above-described embodiments of the inventive concept will be applied to an electronic device such as a memory card 200. For example, the memory card 200 may include a memory controller 220 for controlling data exchange between a host and a memory 210. A static random access memory (SRAM) may be used as an operation memory of a central processing unit (CPU) 224. A host interface 226 may include a data exchange protocol of a host connected to the memory card 200. An error correction code (ECC) unit 228 may detect and correct errors contained in data read from the memory 210. A memory interface 530 contacts the memory 210. The CPU 224 performs a general control operation for data exchange of the memory controller 220.

In one embodiment, the memory 210 applied to the memory card 200 includes the semiconductor memory module 1 according to one of the embodiments of the inventive concept, so a semiconductor memory device having improved reliability may be provided.

Figure 7:
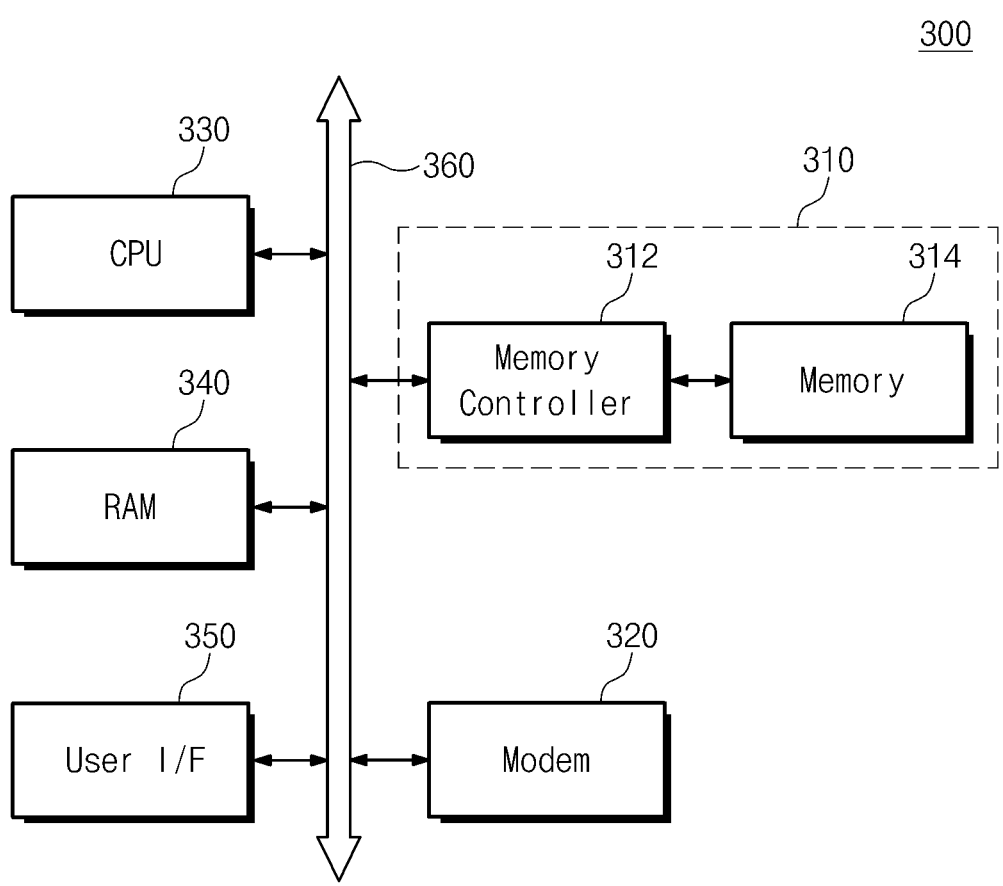
FIG. 7 is a block diagram of an information processing system to which the semiconductor memory module is applied according to embodiments of the inventive concept.

FIG. 7 is a block diagram of an information processing system to which the semiconductor memory module is applied according to embodiments of the inventive concept.

Referring to FIG. 7, the information processing system 300 may be an electronic device including a memory system 310 in which a semiconductor package including the memory according to the embodiments of the inventive concept is disposed. The information processing system 300 may include, for example, a mobile device or a computer. For example, the information processing system 300 may include the memory system 310, a modem 320 electrically connected to a system bus 360, a CPU 330, a RAM 340, and an user interface 350. Data processed by the CPU 330 or data inputted from an external device may be stored in the memory system 310. The memory system 310 may include a memory 314 and a memory controller 312 and may have the substantially same constitutions as the memory card 200 described with reference to FIG. 6. The information processing system 300 may be provided as an electronic device such as a memory card, a solid state disk (SSD), a camera image processor, and other application chipsets. For example, the memory system 310 may be constituted by the SSD. In this case, the information processing system 300 may stably and reliably store large-capacity data in the memory system 310.

The array resistor disposed on the second part of the chip area which corresponds to the edge area of the substrate may be at risk from being separated from the substrate due to the external impact during the handling process to cause the defects in the semiconductor memory module. However, according to embodiments of the inventive concept, one or more of the first to fourth end electrodes may be disposed on the first and third side surfaces of the insulating substrate or the array resistor to increase the bonding force between the array resistor and the module board, thereby improving the yield of the semiconductor memory module. Further, certain module pads may be shared between an electrode on one side of an insulating substrate and an electrode on an adjacent, perpendicular side of the insulating substrate for bonding purposes, further increasing a bonding force between the array resistor and a module board.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description. Therefore, the various embodiments should be considered in descriptive sense only and not for purposes of limitation.

What is claimed is:

1. A semiconductor module, comprising:
a module board;
a plurality of chips mounted on the module board;
a plurality of array resistors mounted on the module board, the plurality of array resistors including at least a first array resistor,
wherein the first array resistor includes:
a substrate comprising a top surface, a bottom surface opposite the top surface, and first to fourth side surfaces connecting the top surface to the bottom surface, the first and third side surfaces being opposite each other, and the second and fourth side surfaces being opposite each other;
a plurality of first electrodes disposed on the first side surface of the substrate, each first electrode including at least a first portion on the first side surface of the substrate and a second portion on the bottom surface of the substrate;
a plurality of second electrodes disposed on the third side surface of the substrate, each second electrode opposite a respective first electrode and including at least a first portion on the third side surface of the substrate and a second portion on the bottom surface of the substrate;
for each pair of respective first and second electrodes opposite each other, a resistor disposed on the substrate between the respective first and second electrodes; and
at least one third electrode disposed on the second side surface of the substrate, the third electrode including at least a first portion on the second side surface of the substrate and a second portion on the bottom surface of the substrate;
a plurality of module pads on a surface of the module board;
a first solder contacting a first module pad of the plurality of module pads and one of the first electrodes;
a second solder contacting a second module pad of the plurality of module pads and one of the second electrodes; and
a third solder contacting a module pad of the plurality of module pads and the third electrode.

2. The semiconductor module of claim 1, wherein:
the module pad that the third solder contacts is the same pad as one of the first module pad and the second module pad.

3. The semiconductor module of claim 1, wherein:
the first solder contacts the one first electrode at the first portion of the one first electrode;
the second solder contacts the one second electrode at the first portion of the one second electrode; and
the third solder contacts the third electrode at the first portion of the third electrode.

4. The semiconductor module of claim 1, wherein:
the second portion of the one first electrode contacts the first module pad;
the second portion of the one second electrode contacts the second module pad; and
the second portion of the third electrode contacts one of the first module pad and the second module pad.

5. The semiconductor module of claim 1, wherein:
the one first electrode contacts the third electrode at a corner of the substrate.

6. The semiconductor module of claim 1, further comprising:
at least one fourth electrode disposed on the fourth side surface of the substrate, the fourth electrode including at least a first portion on the fourth side surface of the substrate and a second portion on the bottom surface of the substrate.

7. The semiconductor module of claim 6, wherein:
the fourth electrode is disposed opposite the third electrode.

8. The semiconductor module of claim 6, wherein:
the one first electrode contacts the third electrode at a corner of the substrate; and
another one of the plurality of first electrodes contacts the fourth electrode at another corner of the substrate.

9. The semiconductor module of claim 1, wherein:
each of the first electrodes, the second electrodes, and the third electrode includes a third portion on the top surface of the substrate, so that each electrode extends from the bottom surface of the substrate to the top surface of the substrate.

10. The semiconductor module of claim 1, wherein:
the first and third side surfaces of the substrate are long-edge surfaces, and
the second and fourth side surfaces of the substrate are short-edge surfaces.

11. The semiconductor module of claim 1, wherein:
the module board includes a chip area having a first part and a second part surrounding three side surfaces of the first part, and a connector portion disposed at one side of the chip portion;

the plurality of chips are mounted on the first part of the chip portion; and the array resistor is disposed on the second part of the chip portion.

12. The semiconductor module of claim 1, wherein:
the semiconductor module is a memory module, and the plurality of chips are memory chips.

13. A semiconductor module, comprising:
a module board;
a plurality of chips mounted on the module board;
a plurality of array resistors mounted on the module board, the plurality of array resistors including at least a first array resistor,
wherein the first array resistor includes:
a substrate comprising a top surface, a bottom surface opposite the top surface, and first to fourth side surfaces connecting the top surface to the bottom surface, the first and third side surfaces being opposite each other, and the second and fourth side surfaces being opposite each other;
a plurality of first electrodes disposed on the first side surface of the substrate, each first electrode including at least a first portion on the first side surface of the substrate and a second portion on the bottom surface of the substrate;
a plurality of second electrodes disposed on the third side surface of the substrate, each second electrode opposite a respective first electrode and including at least a first portion on the third side surface of the substrate and a second portion on the bottom surface of the substrate;
for each pair of respective first and second electrodes opposite each other, a resistor disposed on the substrate between the respective first and second electrodes; and
at least one third electrode disposed on the second side surface of the substrate, the third electrode including at least a first portion on the second side surface of the substrate and a second portion on the bottom surface of the substrate,
wherein each of the first electrodes, the second electrodes, and the third electrode are bonded to the module board.

14. The semiconductor module of claim 13, further comprising:
a plurality of module pads on a surface of the module board;
a first solder contacting a first module pad of the plurality of module pads to bond the first module pad to one of the first electrodes;
a second solder contacting a second module pad of the plurality of module pads to bond the second module pad to one of the second electrodes; and
a third solder contacting and bonded to a module pad of the plurality of module pads and to the third electrode.

15. The semiconductor module of claim 14, wherein:
the module pad that the third solder contacts is the same pad as one of the first module pad and the second module pad.

16. The semiconductor module of claim 15, wherein:
the plurality of chips are mounted on a chip portion of the board and the first array resistor is mounted outside of the chip portion of the board.

17. The semiconductor module of claim 13, wherein:
the one first electrode contacts the third electrode at a corner of the substrate.

18. A semiconductor memory module comprising:
a printed circuit board (PCB) comprising a chip area having a first part and a second part surrounding three side surfaces of the first part and a connector area disposed at one side of the chip area; and
an array resistor disposed on the second part of the chip area to contact a plurality of module pads disposed on a top surface of the PCB,
wherein the array resistor comprises:
a substrate comprising a top surface, a bottom surface opposite the top surface, and first to fourth side surfaces connecting the top surface to the bottom surface, wherein the first and third side surfaces are opposite each other and the second and fourth side surfaces are opposite each other;
a plurality of first central electrodes and a plurality of second central electrodes, each first and second electrode respectively disposed on the second and fourth side surfaces opposite each other on the substrate;
a resistor disposed between each pair of respective first and second central electrodes opposite each other on the substrate; and
an end electrode disposed on at least one of the first and third side surfaces of the substrate,
wherein the end electrode and a first of the central electrodes are bonded to a same first module pad of the plurality of module pads.

19. The semiconductor memory module of claim 18, further comprising:
first and second solders, the first solder bonding the end electrode to the first module pad, and the second solder bonding the first central electrode to the first module pad.

20. The semiconductor memory module of claim 19, wherein:
each of the central electrodes and the end electrode includes at least a first portion on a respective first side surface of the substrate and a second portion on the bottom surface of the substrate;
the first solder bonds the first portion of the end electrode to the first module pad; and
the second solder bonds the first portion of the first central electrode to the first module pad.

* * * * *